US012368143B2

United States Patent
Lei et al.

(10) Patent No.: US 12,368,143 B2
(45) Date of Patent: Jul. 22, 2025

(54) ARRAY SUBSTRATE, LIGHT-EMITTING SUBSTRATE AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jie Lei, Beijing (CN); Zouming Xu, Beijing (CN); Jian Tian, Beijing (CN); Chunjian Liu, Beijing (CN); Xintao Wu, Beijing (CN); Qin Zeng, Beijing (CN); Jie Wang, Beijing (CN); Jianying Zhang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 524 days.

(21) Appl. No.: 17/641,836

(22) PCT Filed: Mar. 10, 2021

(86) PCT No.: PCT/CN2021/080054
§ 371 (c)(1),
(2) Date: Mar. 10, 2022

(87) PCT Pub. No.: WO2022/188072
PCT Pub. Date: Sep. 15, 2022

(65) Prior Publication Data
US 2023/0155089 A1    May 18, 2023

(51) Int. Cl.
*H01L 25/16*    (2023.01)
*H10H 20/857*    (2025.01)
*H10H 29/14*    (2025.01)

(52) U.S. Cl.
CPC ......... *H01L 25/167* (2013.01); *H10H 20/857* (2025.01); *H10H 29/142* (2025.01)

(58) Field of Classification Search
CPC ..... H01L 33/62; H01L 25/167; H01L 27/156; H01L 25/0753; G02F 1/133603; H10H 20/857; H10H 29/142
See application file for complete search history.

(56) References Cited

U.S. PATENT DOCUMENTS

| | | | |
|---|---|---|---|
| 7,227,190 B2 | 6/2007 | Yasukawa | |
| 8,004,079 B2 * | 8/2011 | Tain | ................... H01L 25/0657 257/706 |

(Continued)

FOREIGN PATENT DOCUMENTS

| | | |
|---|---|---|
| CN | 104091570 A | 10/2014 |
| CN | 109239980 A | 1/2019 |

(Continued)

OTHER PUBLICATIONS

Communication from European Application No. 21929551.6 dated Jun. 14, 2023.

(Continued)

*Primary Examiner* — Caleb E Henry
(74) *Attorney, Agent, or Firm* — Calfee, Halter & Griswold LLP

(57) ABSTRACT

The present disclosure relates to the field of display, and provides an array substrate, a light-emitting substrate and a display device. The array substrate includes a base substrate, and a first conductive layer and a second conductive layer stacked on and base substrate and insulated from each other. The array substrate also includes a plurality of groups of light-emitting element terminals arranged in an array on the second conductive layer, for connecting to light-emitting elements; and several groups of sensor terminals located on the second conductive layer for connecting to sensors. The (Continued)

sensors are configured to sense the light-emitting elements, so as to quickly and effectively monitor the light-emitting conditions of the surrounding light-emitting elements, and make more precise adjustments in time to various parameters of the light-emitting elements, ensuring the stable performance of each light-emitting element.

20 Claims, 13 Drawing Sheets

(56) References Cited

U.S. PATENT DOCUMENTS

| | | | |
|---|---|---|---|
| 8,208,094 B2* | 6/2012 | Koganezawa | G02F 1/133615 362/97.3 |
| 8,727,571 B2 | 5/2014 | Yu | |
| 9,570,002 B2 | 2/2017 | Sakariya et al. | |
| 10,304,813 B2* | 5/2019 | Kuo | H01L 25/0753 |
| 10,401,556 B2* | 9/2019 | Lee | H01L 33/60 |
| 10,401,557 B2* | 9/2019 | Kim | G02B 6/0073 |
| 10,958,841 B2 | 3/2021 | Takagi et al. | |
| 11,009,747 B2* | 5/2021 | Zheng | G02F 1/136286 |
| 11,217,625 B2* | 1/2022 | Cho | H01L 33/56 |
| 2002/0131145 A1* | 9/2002 | Lin | H01L 33/62 257/E33.059 |
| 2004/0252867 A1* | 12/2004 | Lan | G06V 40/1318 382/124 |
| 2005/0253158 A1 | 11/2005 | Yasukawa et al. | |
| 2010/0148702 A1 | 6/2010 | Shen | |
| 2013/0320361 A1* | 12/2013 | Huang | H01L 25/0753 257/88 |
| 2015/0015147 A1 | 1/2015 | Knapp | |
| 2015/0364107 A1 | 12/2015 | Sakariya et al. | |
| 2016/0035701 A1* | 2/2016 | West | H01L 23/49816 257/738 |
| 2017/0294421 A1* | 10/2017 | Huang | H10H 20/857 |
| 2018/0031759 A1* | 2/2018 | Kong | G02B 6/0068 |
| 2018/0047883 A1* | 2/2018 | Marutani | G02B 6/0006 |
| 2018/0198890 A1 | 7/2018 | Dhanabalan et al. | |
| 2018/0198980 A1 | 7/2018 | Dhanabalan et al. | |
| 2019/0012956 A1* | 1/2019 | Li | H01L 25/0753 |
| 2019/0164945 A1* | 5/2019 | Chae | H01L 25/13 |
| 2019/0189596 A1* | 6/2019 | Chae | H01L 33/50 |
| 2019/0198485 A1* | 6/2019 | Chae | H01L 33/382 |
| 2019/0198565 A1* | 6/2019 | Lee | H01L 33/30 |
| 2019/0252358 A1* | 8/2019 | Yoo | H01L 21/67144 |
| 2019/0378744 A1* | 12/2019 | Liu | H10H 20/855 |
| 2020/0091193 A1* | 3/2020 | Ren | H01L 27/1248 |
| 2020/0201117 A1* | 6/2020 | Zheng | G02B 5/0205 |
| 2021/0320227 A1* | 10/2021 | Kishimoto | H01L 25/167 |
| 2021/0336099 A1* | 10/2021 | Kishimoto | H01L 25/167 |
| 2021/0343905 A1* | 11/2021 | Kishimoto | H01L 33/62 |
| 2021/0358998 A1* | 11/2021 | Kishimoto | H01L 33/40 |
| 2021/0358999 A1* | 11/2021 | Kishimoto | H01L 25/167 |
| 2021/0408105 A1* | 12/2021 | Kishimoto | H01L 33/60 |
| 2021/0408106 A1* | 12/2021 | Kishimoto | H01L 27/156 |
| 2021/0408107 A1* | 12/2021 | Kishimoto | H01L 33/60 |
| 2021/0408340 A1* | 12/2021 | Kishimoto | H01L 25/167 |
| 2021/0408341 A1* | 12/2021 | Kishimoto | H01L 33/483 |
| 2022/0005976 A1* | 1/2022 | Kishimoto | H01L 33/502 |

FOREIGN PATENT DOCUMENTS

| | | |
|---|---|---|
| CN | 109346016 A | 2/2019 |
| CN | 109741684 A | 5/2019 |
| CN | 210245499 U | 4/2020 |
| CN | 111627346 A | 9/2020 |
| CN | 111798802 A | 10/2020 |
| CN | 211654192 U | 10/2020 |
| CN | 112054017 A | 12/2020 |
| CN | 109741684 B | 3/2021 |
| WO | 2021010219 A1 | 1/2021 |

OTHER PUBLICATIONS

Written Opinion from PCT/CN2021/080054 dated Dec. 8, 2021.
First Office Action of application No. 2022-564809 dated Dec. 23, 2024.

* cited by examiner

ARRAY SUBSTRATE, LIGHT-EMITTING SUBSTRATE AND DISPLAY DEVICE

CROSS REFERENCE TO RELATED APPLICATION

The present application is a 35 U.S.C. 371 national phase application of PCT International Application No. PCT/CN2021/080054 filed on Mar. 10, 2021, the entire content of which is incorporated herein by reference in its entirety.

TECHNICAL FIELD

The present disclosure relates to the field of display technology, and in particular, to an array substrate, a light-emitting substrate and a display device.

BACKGROUND

MiniLEDs, also known as sub-millimeter light-emitting diodes, have die sizes of about 100 to 300 um. While for MicroLEDs, the die size is less than 100 um. At present, the research and development of MiniLEDs and MicroLEDs in the field of backlight and display is continuously deepening, in order to achieve products of better quality.

It should be noted that the information disclosed in the Background section is only for enhancement of understanding of the background of the present disclosure, and therefore may contain information that does not form the prior art that is already known to a person of ordinary skill in the art.

SUMMARY

The purpose of the present disclosure is to overcome the above-mentioned deficiencies of the prior art, and provide an array substrate, a light-emitting substrate and a display device.

According to an aspect of the present disclosure, an array substrate is provided, including a base substrate, and a first conductive layer and a second conductive layer stacked on the base substrate and insulated from each other. The array substrate further includes: a plurality of groups of light-emitting element terminals, arranged in an array on the second conductive layer for coupling with light-emitting elements; a plurality of groups of sensor terminals, arranged on the second conductive layer used for coupling with sensors, where no overlap exists between an orthographic projection of the groups of sensor terminals on the base substrate and an orthographic projection of the groups of light-emitting element terminals on the base substrate; a first group of signal lines, disposed on the first conductive layer and electrically connected to the groups of sensor terminals, for driving the sensors to sense; and a second group of signal lines, disposed on the first conductive layer and electrically connected to the groups of light-emitting element terminals for driving light-emitting elements to emit light.

In an exemplary embodiment of the present disclosure, each group of sensor terminals includes an input terminal, an output terminal, a power terminal, and a common voltage terminal; and each sensor includes an input pin, an output pin, a power pin, and a common voltage pin. The input terminal is configured for electrical connection with the input pin, the output terminal is configured for electrical connection with the output pin, the power terminal is configured for electrical connection with the power pin, and the common voltage terminal is configured for electrical connection with the common voltage pin.

The first group of signal lines includes input signal lines, output signal lines, power signal lines and first common voltage signal lines.

The input terminal is electrically connected to the input signal lines, the output terminal is electrically connected to the output signal lines, the power terminal is electrically connected to the power signal lines, and the common voltage terminal is electrically connected to the first common voltage signal lines.

In an exemplary embodiment of the present disclosure, the plurality of groups of sensor terminals are uniformly arranged in an array along a row direction and a column direction.

In an exemplary embodiment of the present disclosure, the number of the input signal lines and the number of the output signal lines are both 1.

In the column direction, among two adjacent groups of sensor terminals located in the same column, the output terminal of one group of sensor terminals is electrically connected to the input terminal of the other group of sensor terminals; and among the groups of sensor terminals located in two adjacent columns, the output terminal of the group of sensor terminals located in one column and the first row or the last row is electrically connected with the input terminal of the group of sensor terminals located in the other column and the first row or the last row, so that all the sensors are connected in series.

Among all the groups of sensor terminals connected in series, the input terminal of the group of sensor terminals at one end is connected to the input signal lines, and the output terminal of the group of sensor terminals at the other end is connected to the output signal lines.

In an exemplary embodiment of the present disclosure, in the first group of signal lines, the number of the input signal lines is equal to the number of the sensor terminals in the row direction, and the number of the output signal lines is equal to the number of the sensor terminals in the row direction.

In the column direction, among two adjacent groups of sensor terminals located in the same column, the output terminal of one group of sensor terminals is electrically connected with the input terminal of the other group of sensor terminals; and among the groups of sensor terminals located in the same column, the input terminal of the first group of sensor terminals is connected to one of the input signal lines, and the output terminal of the last group of sensor terminals is connected to one of the output signal lines, so that all the sensors located in each column are connected in series.

In an exemplary embodiment of the present disclosure, in the first group of signal lines, the number of the input signal lines is equal to the number of the groups of sensor terminals in the row direction, and the number of the output signal lines is equal to the number of the groups of sensor terminals in the row direction.

In the column direction, the input terminal of each group of sensor terminals located in the same column is connected to the same input signal line, and the output terminal of each group of sensor terminals located in the same column is connected to the same output signal line.

In an exemplary embodiment of the present disclosure, in the first group of signal lines, the number of the power signal lines is equal to the number of the sensor terminals in the row direction.

In the column direction, the power terminal of each group of sensor terminals located in the same column is connected to the same power signal line.

In an exemplary embodiment of the present disclosure, in the first group of signal lines, the number of the first common voltage signal lines is equal to the number of the groups of sensor terminals in the row direction.

In the column direction, the common voltage terminal of each group of sensor terminals in the same column is connected to the same first common voltage signal line.

In an exemplary embodiment of the present disclosure, the array substrate further includes a plurality of first leads, the first leads connecting the output terminals and the input terminals of two adjacent groups of sensor terminals.

The first leads include first column leads extending along the column direction and first row leads extending along the row direction. Each of the first column leads is provided on the first conductive layer. Each of the first row leads is disposed on the second conductive layer. The first column leads and the first row leads are electrically connected through via holes.

In an exemplary embodiment of the present disclosure, the first column leads connected to each group of sensor terminals located in the same column are arranged at intervals along the column direction.

In an exemplary embodiment of the present disclosure, the array substrate further includes: a plurality of groups of capacitor terminals, arranged on the second conductive layer for binding capacitors. The groups of capacitor terminals include a first capacitor terminal and a second capacitor terminal. The first capacitor terminal is connected with the power terminal. The second capacitor terminal is connected with the common voltage terminal.

In an exemplary embodiment of the present disclosure, the array substrate further includes a second lead and a third lead provided on the second conductive layer. The second lead is connected to the first capacitor terminal and the power signal lines. The third lead is connected to the first capacitor terminal and the power terminals of the groups of sensor terminals.

In an exemplary embodiment of the present disclosure, the second group of signal lines includes second common voltage signal lines, drive voltage signal lines, source power lines, and source address lines.

The second common voltage signal lines are re-used as the first common voltage signal lines.

In an exemplary embodiment of the present disclosure, an orthographic projection of the groups of sensor terminals on the base substrate at least partially coincides with an orthographic projection of the second group of signal lines on the base substrate.

In an exemplary embodiment of the present disclosure, an orthographic projection of the groups of sensor terminals on the base substrate and an orthographic projection of the groups of light-emitting element terminals on the base substrate are respectively located in orthographic projections on the base substrate of different signal lines in the second group of signal lines.

In an exemplary embodiment of the present disclosure, an orthographic projection of the groups of sensor terminals on the base substrate overlaps with an orthographic projection of the drive voltage signal lines on the base substrate, and an orthographic projection of the groups of light-emitting element terminals on the base substrate overlaps with an orthographic projection of the second common voltage signal lines on the base substrate.

In an exemplary embodiment of the present disclosure, each input signal line, each output signal line, and each power signal line are located between one of the second common voltage signal lines and one of the drive voltage signal lines.

In an exemplary embodiment of the present disclosure, the array substrate further includes common voltage signal auxiliary lines disposed on the second conductive layer. The common voltage signal auxiliary lines are electrically connected to the first common voltage signal lines through via holes.

In an exemplary embodiment of the present disclosure, the array substrate further includes a fourth lead provided on the second conductive layer. The fourth lead connects the plurality of groups of light-emitting element terminals in sequence, so that all the plurality of light-emitting elements are connected in series to form a light-emitting unit.

Each group of sensor terminals is located at a gap between two adjacent light-emitting units, or each group of sensor terminals is located between the groups of light-emitting element terminals in each light-emitting unit.

In an exemplary embodiment of the present disclosure, the array substrate further includes: groups of drive circuit terminals, arranged on the second conductive layer for coupling with drive circuits. An orthographic projection of the groups of drive circuit terminals on the base substrate overlaps with none of orthographic projections on the base substrate of the groups of light-emitting element terminals and the groups of sensor terminals.

In an exemplary embodiment of the present disclosure, an orthographic projection of the groups of drive circuit terminals on the base substrate at least partially coincides with an orthographic projection of the second group of signal lines on the base substrate, and an orthographic projection of the groups of drive circuit terminals on the base substrate and an orthographic projection of the groups of sensor terminals on the base substrate are respectively located in orthographic projections on the base substrate of different signal lines in the first group of signal lines.

In an exemplary embodiment of the present disclosure, positions of the group of light-emitting element terminals located at the outermost side in each light-emitting unit are sequentially connected to form a polygon, and the groups of drive circuit terminals are located outside of the polygon.

In an exemplary embodiment of the present disclosure, the array substrate includes P rows and Q columns of the light-emitting units. Each group of drive circuit terminals drives one of the light-emitting units. Positions of the groups of drive circuit terminals corresponding to four of the light-emitting units at coordinates of (a, b), (a+1, b), (a, b+1), (a+1, b+1) form a convex quadrilateral, where $1 \leqslant a \leqslant P$ and $1 \leqslant b \leqslant Q$.

In an exemplary embodiment of the present disclosure, the convex quadrilateral is composed of two isosceles triangles, and each isosceles triangle is composed of positions of any three groups of drive circuit terminals corresponding to the four light-emitting units.

According to another embodiment of the present disclosure, a light-emitting substrate is provided, including: the above-mentioned array substrate; light-emitting elements, coupled to the groups of light-emitting element terminals of the array substrate; and sensors, coupled to the groups of sensor terminals of the array substrate.

According to still another embodiment of the present disclosure, there is provided a display device, including the above-mentioned light-emitting substrate.

It is to be understood that the foregoing general description and the following detailed description are exemplary and explanatory only, and are not restrictive of the present disclosure.

BRIEF DESCRIPTION OF THE DRAWINGS

The accompanying drawings, which are incorporated in and constitute a part of the present specification, illustrate embodiments consistent with the present disclosure and together with the present description serve to explain the principle of the present disclosure. Obviously, the drawings in the following description are only some embodiments of the present disclosure, and for those of ordinary skill in the art, other drawings may also be obtained from these drawings without creative efforts.

Figure 1:
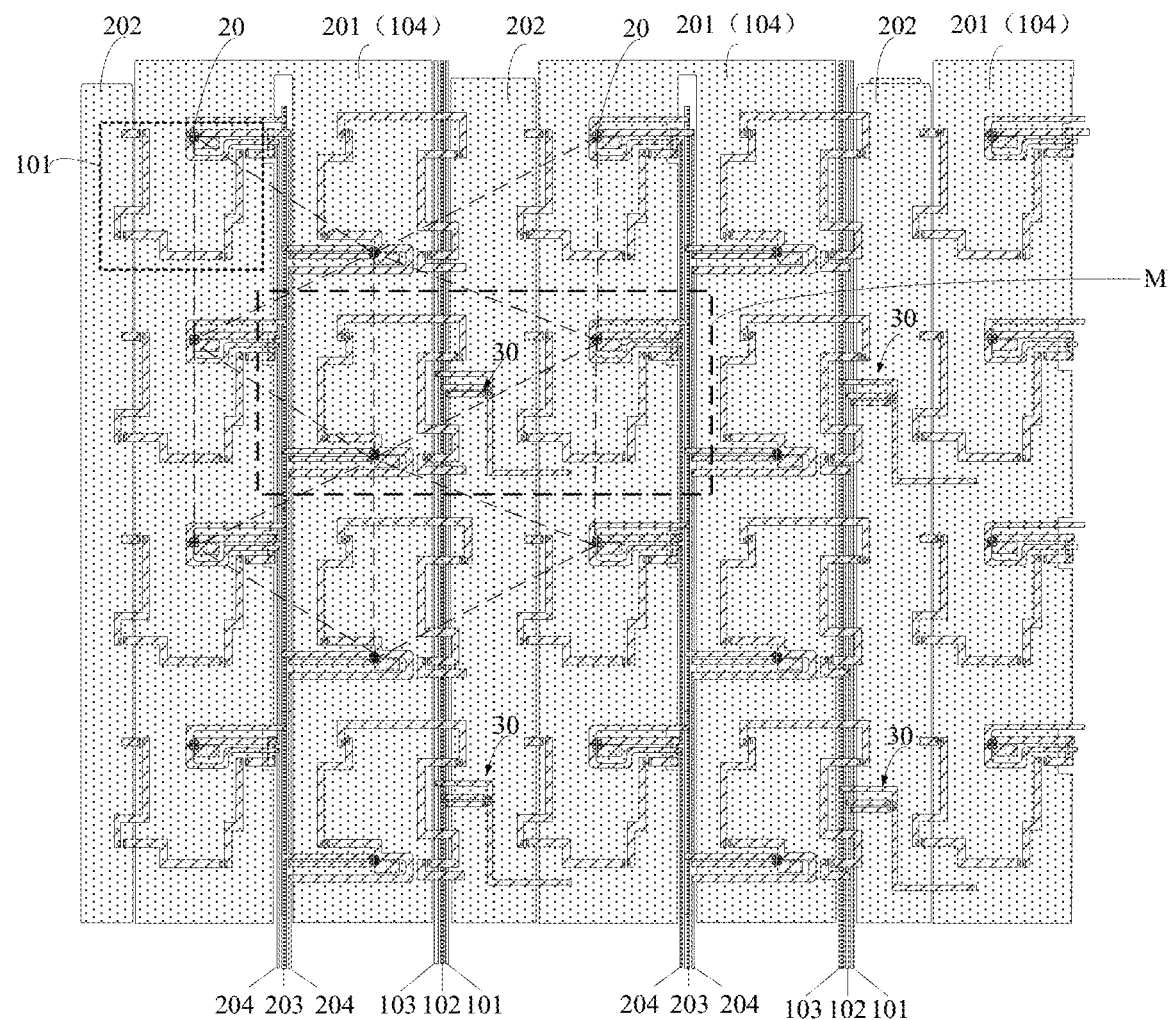
FIG. 1 is a schematic partial structure diagram of an array substrate of a mini LED according to an embodiment of the present disclosure.

LIST OF REFERENCE NUMBERS 100, first conductive layer; 200, second conductive layer; 300, insulation layer; 400, insulation layer; 900, base substrate; 10, group of light-emitting element terminals; 11, anode terminal; 12, cathode terminal; 101, light-emitting unit; 20, group of drive circuit terminals; 21, input terminal; 22, power terminal; 23, output terminal; 24, first common voltage terminal; 30, group of sensor terminals; 31, input terminal; 32, output terminal; 33, power terminal; 34, second common voltage terminal; 40, group of capacitor terminals; 41, first capacitor terminal; 42, second capacitor terminal; 101, input signal line; 102, output signal line; 103, power signal line; 104, first common voltage signal line; 105, first lead; 1051, first column lead; 1052, first row lead; 106, second lead; 107, third lead; 108, fourth lead; 201, second common voltage signal line; 202, drive voltage signal line; 203, power line; 204, source address line; 205, common voltage signal auxiliary line; 5, slot.

DETAILED DESCRIPTION OF THE EMBODIMENTS

Example embodiments will now be described more fully with reference to the accompanying drawings. Example embodiments, however, may be embodied in various forms and should not be construed as limited to embodiments set forth herein. Rather, these embodiments are provided so that the present disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of embodiments of the present disclosure provided, and are not necessarily drawn to scale.

Although relative terms such as "upper" and "lower" are used in the present specification to describe the relative relationship between one component represented by an icon and another component, these terms are used in the present specification only for convenience, such as based on the direction in the example as described. It will be appreciated that if the device represented by the icon is turned upside down, the component described as being "on" the device will become a component being "beneath" the device. When a particular structure is "on" another structure, it may mean that the particular structure is integrally formed on the other structure, or that the particular structure is "directly" arranged on the other structure, or that the particular structure is "indirectly" arranged on the other structure through a third structure.

The terms "a", "an", "the", "said" and "at least one" are used to indicate the presence of one or more elements or components, etc. The terms "include" and "have" are used to indicate an open inclusion, and means that additional elements or components, etc may be present in addition to the listed elements or components, etc. The terms "first", "second" and "third" etc. are only used as a marker, not as a limit on the number of the relevant objects.

Embodiments of the present disclosure provide an array substrate, on which light-emitting elements may be bound, thereby serving as a backlight source for a Mini-LED display device. Sensors may also be bound on the array substrate to sense the light-emitting performance of the light-emitting elements, so as to monitor the light-emitting conditions of the backlight source.

Figure 2:
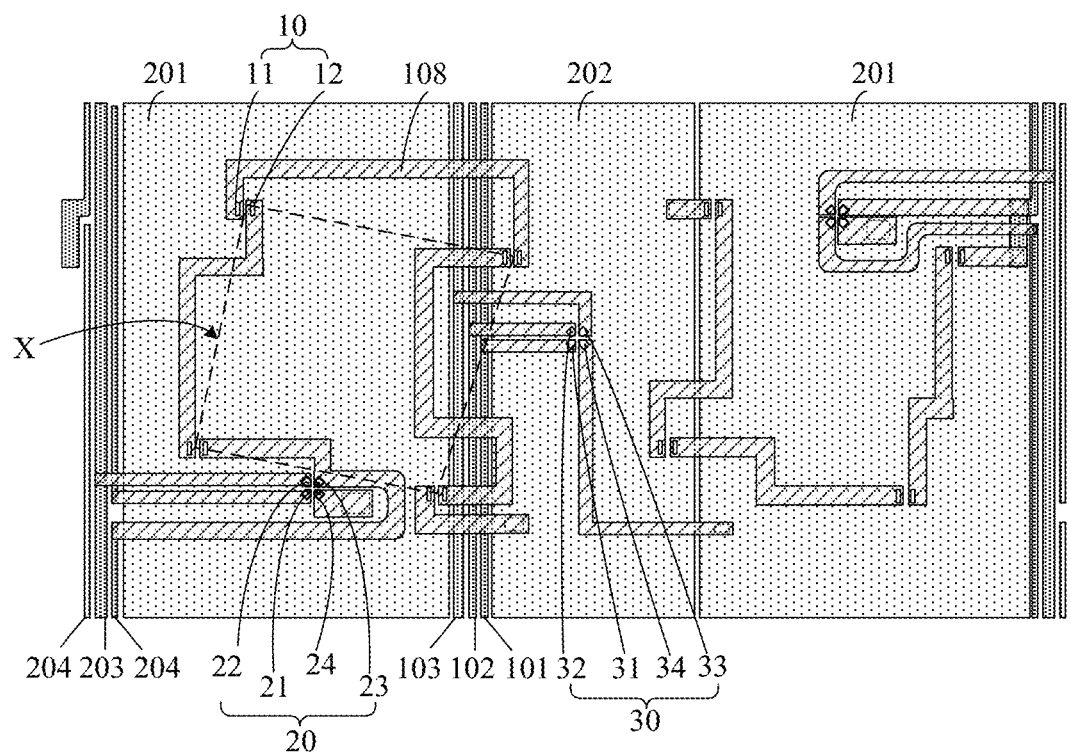
FIG. 2 is a partial enlarged schematic diagram of the M area in FIG. 1.
Figure 3:
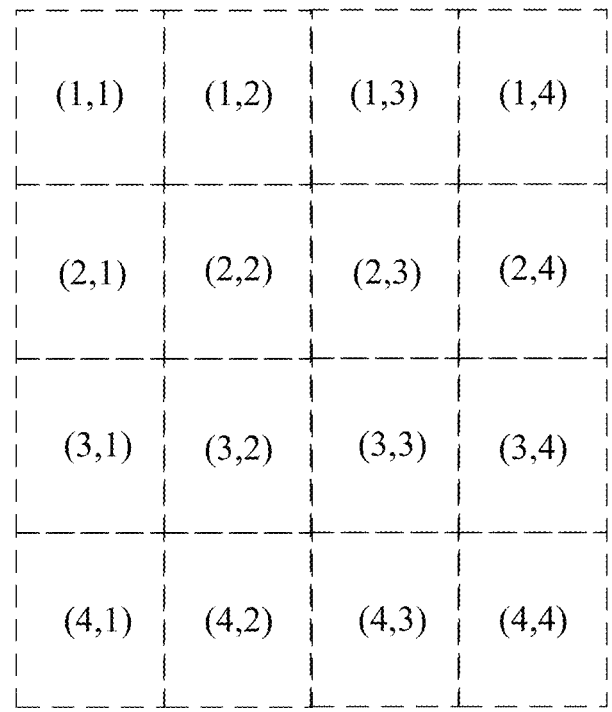
FIG. 3 is a schematic arrangement diagram of light-emitting units.
Figure 4:
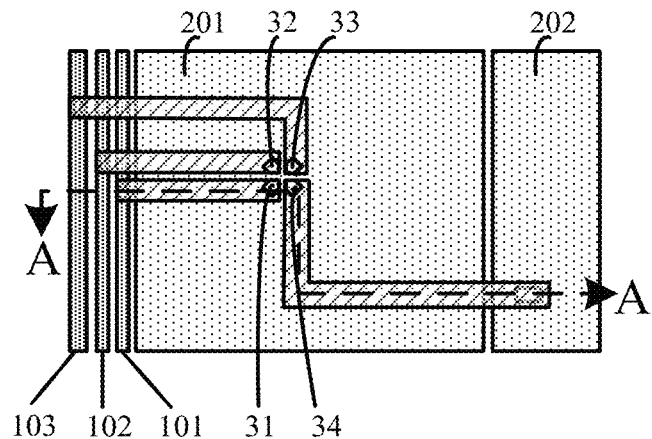
FIG. 4 is a schematic structural diagram of the group of sensor terminals.

In an embodiment of the present disclosure, FIG. 1 is a schematic partial structure diagram of an array substrate of a mini LED according to an embodiment of the present disclosure, FIG. 2 is a partial enlarged schematic diagram of the M area in FIG. 1, FIG. 3 is a structural schematic diagram of the group of sensor terminals, and FIG. 4 is a schematic cross-sectional view along the AA direction in FIG. 3. Referring to FIGS. 1-4, the Mini-LED array substrate includes a base substrate 900, a first conductive layer 100 and a second conductive layer 200. The first conductive layer 100 is provided at one side of the base substrate 900, and the second conductive layer 200 is provided at the side of the first conductive layer 100 away from the base substrate 900. An insulation layer 300 is provided between the first conductive layer 100 and the second conductive layer 200. An insulation layer 400 is provided above the second conductive layer, and an opening area is provided on the insulation layer 400 to expose terminals.

In an embodiment of the present disclosure, the first conductive layer 100 is used to arrange various signal lines, including a first group of signal lines for driving the sensors, and a second group of signal lines for driving the light-emitting elements to emit light. In some embodiments, a layered structure containing MoNb/Cu/MoNb may be sequentially formed by a sputtering process, where the bottom layer of MoNb is used to improve adhesion, the top layer of MoNb is used to prevent oxidation, and the middle layer of Cu is used as the main part of the signal line. The material has characteristics such as low resistivity. At the same time, the width and the thickness of the signal line may be increased to further reduce the resistance of the signal line. In other embodiments, the intermediate layer of Cu may be formed by an electroplating process. In this case, the bottom layer may be made of MoNiTi through a sputtering process as a seed layer, so as to increase the nucleation density of metal Cu grains during electroplating. Finally, an anti-oxidation layer of MoNiTi or MoNb may be formed through a sputtering process.

The second conductive layer 200 is provided with a plurality of groups of light-emitting element terminals 10 coupled with the light-emitting elements. The second conductive layer 200 is further provided with several groups of sensor terminals 30 connected with the sensors. The groups of sensor terminals 30 are arranged among the groups of light-emitting element terminals 10. The orthographic projection of the groups of sensor terminals 30 on the base substrate does not overlap with the orthographic projection of the groups of light-emitting element terminals 10 on the base substrate. The second conductive layer 200 may form a layered structure of MoNb/Cu/CuNi through a sputtering process in sequence, where the bottom layer of MoNb is used to improve adhesion, and the top surface adopts CuNi for both anti-oxidation and solid crystal solidity.

It should be noted that the groups of light-emitting element terminals 10 according to an embodiment of the present disclosure are used to electrically connect the light-emitting elements to the second group of signal lines on the base substrate. The light-emitting elements may be bound on the array substrate by welding. Thus, the groups of light-emitting element terminals 10 may be a group of pads. The light-emitting elements may also be directly fabricated on the base substrate through a film forming process. Thus, the groups of light-emitting element terminals 10 may also be a group of electrodes that plays a conductive role. Similarly, the groups of sensor terminals 30 according to an embodiment of the present disclosure may also be a group of pads or a group of electrodes.

Providing sensors on the array substrate helps to quickly and effectively monitor the light-emitting conditions of the surrounding light-emitting elements, so as to adjust the current, voltage, brightness and other parameters of the light-emitting elements in a timely and finer way, thereby ensuring the stable performance of each light-emitting element.

Sensors may be of various types according to their functions. For example, the sensor may be a temperature sensor for detecting the temperature of the surrounding light-emitting elements, and adjusting parameters such as voltage and current in time, so as to avoid system insensitivity caused by overheating, or broken lines caused by excessive voltage and current, etc. The sensor may also be a photosensitive sensor for detecting the brightness of the surrounding light-emitting elements, adjusting the brightness of each light-emitting element in time, and keeping the light-emitting brightness of each light-emitting element consistent and stable. In an embodiment, the sensor may be an integrated sensor integrated on a chip, which is bound on the array substrate through the group of sensor terminals 30.

The array substrate in some embodiments of the present disclosure will be further described in detail below.

With reference to FIGS. 1 and 2, a plurality of light-emitting elements are arranged in an array, and one light-emitting unit 101 includes four light-emitting elements connected in series. The light-emitting element electrically connected to the drive voltage signal line 202 is used as the start point of the four light-emitting elements connected in series, and the light-emitting element electrically connected to the control circuit is used as the end point of the four light-emitting elements connected in series. The four light-emitting elements are driven by one control circuit. Therefore, a fourth lead 108 is further provided in the second conductive layer 200 of the array substrate. The fourth lead 108 connects the four groups of light-emitting element terminals 10 in sequence, so that the four light-emitting elements are connected in series to form a light-emitting unit 101. It should be noted that, in an example provided by an embodiment of the present disclosure, the number of light-emitting elements in each light-emitting unit is not limited, and may be any number such as 5, 6, 7, and 8, but not limited only to 4. Meanwhile, the light-emitting element may be an LED or any other light-emitting element.

In some examples, according to a specific implementation, with reference to FIG. 1, the light-emitting elements in the same light-emitting unit 101 are sequentially connected to form a polygon. For example, when the light-emitting unit 101 includes four light-emitting elements, the four light-emitting elements may be sequentially connected to form a quadrangle. Two sides of the quadrilateral may be parallel to the row direction, and the other two sides of the quadrilateral may be parallel to the column direction. Alternatively, two sides of the quadrilateral may also have an included angle with respect to the row direction, and the other two sides of the quadrilateral may also have an included angle with respect to the column direction. Therefore, the four groups of light-emitting element terminals 10 in each light-emitting unit 101 are also arranged in the respective shapes.

Accordingly, positions of the groups of light-emitting element terminals 10 corresponding to the four light-emitting elements in one light-emitting unit 101 may be connected to each other to obtain a polygon (indicated by the dotted box X in the figures). Specifically, it may be a parallelogram. It can be understood that the vertex of the quadrilateral may be the geometric center of each group of light-emitting element terminals 10. Herein, attention should be paid to the difference between the dotted box X in FIG. 2 and the dotted box in FIG. 1. The dotted box X in FIG. 2 represents the position of the group of light-emitting element terminals 10, and the dotted box in FIG. 1 only roughly depicts the division of the light-emitting unit 101. In some examples, according to an implementation, among the adjacent light-emitting units 101 in the row direction, the light-emitting elements located at the same position in each light-emitting unit 101 may be approximately arranged on the same straight line along the row direction. Further, among the adjacent light-emitting units in the column direction, the light-emitting elements located at the same position in each light-emitting unit 101 may be roughly arranged on the same straight line along the column direction. Therefore, the groups of light-emitting element terminals 10 in the row direction and the column direction are also arranged according to the respective ways.

Further, among the four groups of light-emitting element terminals 10 connected in series, the fourth lead 108 between any two groups of light-emitting element terminals 10 connected in series through the fourth lead 108 includes a plurality of sub-segments extending in the row direction and/or the column direction. The fourth lead is composed of a plurality of sub-segments along the row and column directions, which is convenient to manufacture. Besides, it may reduce the probability of short circuit between two terminals in the same group of light-emitting element terminals, and also reduce the occurrence of short circuit of the fourth lead due to the gap between the signal line in the first conductive layer and its adjacent signal line. Referring specifically to FIG. 2, the fourth lead 108 of the upper left group of light-emitting element terminals 10 extends to the lower left group of light-emitting element terminals 10 along the column direction, row direction, and column direction in sequence.

Referring to FIG. 2, in an embodiment, the group of light-emitting element terminals 10 includes two terminals, one being the anode terminal 11 and the other being the cathode terminal 12. The anode terminal 11 is connected to an anode pin of the light-emitting element, and the cathode terminal 12 is connected to the other cathode pin of the light-emitting element.

The light-emitting element according to an embodiment of the present disclosure is driven to emit light by a control circuit. Therefore, the array substrate according to an embodiment of the present disclosure may be further provided with a group of drive circuit terminals 20. Similar to the light-emitting element and the sensor, the drive circuit may also be integrated in the chip and bound to the array substrate by welding. Thus, the group of drive circuit terminals 20 may be a group of pads, and may also be directly prepared on the base substrate through a film forming process. Therefore, the group of drive circuit terminals 20 may also be a group of electrodes that plays a conductive role. It can be understood that the orthographic projection of the group of drive circuit terminals 20 on the base substrate does not overlap with the orthographic projections of the group of light-emitting element terminals 10 and the group of sensor terminals 30 on the base substrate.

In an embodiment, the control circuit for driving the light-emitting element to emit light may be a microchip. The size (e.g., length) of the microchip may be in the order of tens or hundreds of microns. The chip area may be about tens of thousands of square microns or hundreds of square micrometers or even smaller. This is similar in size to Mini-LEDs, has miniaturization features, and is easy to integrate into the array substrate 10 (e.g., bound and coupled to the surface of the array substrate 10), thereby simplifying the overall structure and facilitating the realization of a light and thin product. Each control circuit directly drives one light-emitting unit 101, which avoids problems such as complicated operation and easy flickering in the line scan control mode. In addition, the drive circuit 110 has a small number of terminals, a small number of required signals, a simple control method, a simple wiring method, and low cost.

FIG. 1 and FIG. 2 also show the structure of the group of drive circuit terminals 20 coupled with the drive circuit. The group of drive circuit terminals 20 includes four terminals, which are respectively the input terminal 21 for connecting with the Di pin of the drive circuit, a power terminal 22 for connecting with the Pwr pin of the drive circuit, an output terminal 23 for connecting with the Out pin of the drive circuit, and a common voltage terminal 24 for connecting with the Gnd pin of the drive circuit.

Referring to FIG. 1 and FIG. 2, the first conductive layer 100 is provided with a second group of signal lines for driving the light-emitting elements to emit light. The second group of signal lines includes a second common voltage signal line 201, a drive voltage signal line 202, a power line 203, and a source address line 204. The above-mentioned input terminal 21 is configured to receive a first input signal, such as an address signal, for gating a drive circuit at a corresponding address. For example, the first input signal may be 8-bit start address information transmitted from the source address line 204. The address of the first drive circuit corresponding to the address signal may be obtained by analyzing the address signal. The power terminal 22 is configured to receive a second input signal, e.g., a power line carrier communication signal from the power line 203. The second input signal not only provides power for the drive circuit, but also transmits communication data to the drive circuit. The communication data may be used to determine the light-emitting duration of the respective light-emitting unit, thereby controlling the visual light-emitting brightness thereof. The output terminal 23 is configured to output, in the first period of time, a relay signal to the next stage of drive circuit with a cascade relationship thereof. The relay signal includes address information. The address of the corresponding drive circuit may be obtained by analyzing the address signal. The output terminal 23 is further configured to form a signal loop for the respective light-emitting unit within the second period, so that the light-emitting unit may emit with the respective brightness. The common voltage terminal 24 is configured to receive a common voltage signal, such as a ground signal from the second common voltage signal line 201. In an embodiment of the present disclosure, the second common voltage signal line 201, the drive voltage signal line 202, the power line 203, and the source address line 204 all extend in the column direction and are arranged at intervals in the row direction.

As shown in FIG. 1, the arrangement having four light-emitting elements and drive circuits in one light-emitting unit 101 is considered as a repeating unit, the array substrate may include a plurality of repeating units, and adjacent repeating units are arranged at intervals, particularly arranged periodically along the row and column directions. In this way, one group of light-emitting units may be used as a repeating unit for repeating arrangement. For example, in a plurality of light-emitting units arranged in the column direction, the relative positions among the plurality of light-emitting elements and the drive circuits in each light-emitting unit may be substantially the same. In the light-emitting units arranged along the row direction, the relative positions among the plurality of light-emitting elements and the drive circuits in two adjacent light-emitting units may be arranged in a center symmetrical way.

As shown in FIG. 2, the group of drive circuit terminals 20 is located outside of the quadrangle (shown by the dotted box X in the figures) obtained by sequentially connecting positions of the four groups of light-emitting element terminals 10 connected in series, so as to facilitate wiring of the fourth lead 108. In the meanwhile, this helps to minimize influences of the drive circuit on the light output of the light-emitting element. It can be understood that when each light-emitting unit includes n×m groups of light-emitting element terminals, positions of the plurality of groups of light-emitting element terminals located at the outermost side in the light-emitting unit may be sequentially connected to obtain a polygon, and the group of drive circuit terminals 20 is located outside of the polygon. Herein, positions of the outermost groups of light-emitting element terminals in the light-emitting unit refer to the geometric centers of the above-mentioned groups of light-emitting element terminals. The non-outermost groups of light-emitting element terminals in the light-emitting unit are located inside the aforementioned polygon.

For the convenience of description, the light-emitting units 101 in the array substrate are marked with coordinates according to the arrangement of rows and columns. For example, there are P rows and Q columns of light-emitting units 101 on the array substrate, and the light-emitting unit 101 in the a-th row and the b-th column may correspond to the coordinate of (a, b), where $1 \leq a \leq P$, $1 \leq b \leq Q$, and P, Q, a, and b are all positive integers. FIG. 3 shows the arrangement structure and coordinates of some light-emitting units 101.

In an embodiment, positions of the groups of drive circuit terminals corresponding to the four light-emitting units 101 having coordinates of (a, b), (a+1, b), (a, b+1), and (a+1, b+1) are connected in sequence to obtain a convex quadrilateral, for example, a parallelogram. Specifically, it may be a rectangle or a square. Obviously, each convex quadrilateral is composed of two triangles, and the two triangles are each composed of positions of three groups of drive circuit terminals 20 in the four light-emitting units 101.

In some embodiments, each parallelogram may be composed of two isosceles triangles or equilateral triangles, and each isosceles triangle or equilateral triangle is composed of positions of three groups of drive circuit terminals 20 in the four light-emitting units 101. When each parallelogram is composed of two equilateral triangles, distances between the respective groups of drive circuit terminals 20 may be close. It should be noted that the terms of "isosceles triangle" and "equilateral triangle" as described here are idealized descriptions. In actual products, due to influences by process and equipment accuracies, the general shape thereof may be the isosceles triangle and the equilateral triangle.

In some embodiments, referring to FIGS. 1-3, the group of drive circuit terminals 20 in the light-emitting unit (1, 1), the group of drive circuit terminals 20 in the light-emitting unit (1, 2), and the group of drive circuit terminals 20 in the light-emitting unit (2, 1) are respectively located at the three vertices of the triangle, for example, the three vertices of the first triangle. The group of drive circuit terminals 20 in the light-emitting unit (2, 1), the group of drive circuit terminals 20 in the light-emitting unit (1, 2), and the group of drive circuit terminals 20 in the light-emitting unit (2, 2) may be located at the three vertices of the triangle respectively, for example, the three vertices of the second triangle. The group of drive circuit terminals 20 in the light-emitting unit (2, 1), the group of drive circuit terminals 20 in the light-emitting unit (2, 2), and the group of drive circuit terminals 20 in the light-emitting unit (3, 1) may be located at the three vertices of the triangle respectively, such as the three vertices of the third triangle. The group of drive circuit terminals 20 in the light-emitting unit (3, 1), the group of drive circuit terminals 20 in the light-emitting unit (2, 2), and the group of drive circuit terminals 20 in the light-emitting unit (3, 2) may be located at the three vertices of the triangle respectively, for example, at the three vertices of the fourth triangle. The group of drive circuit terminals 20 in the light-emitting unit (1, 2), the group of drive circuit terminals 20 in the light-emitting unit (1, 3), and the group of drive circuit terminals 20 in the light-emitting unit (2, 3) may be located at the three vertices of the triangle respectively, for example at the three vertexes of the fifth triangle. The group of drive circuit terminals 20 in the light-emitting unit (2, 3), the group of drive circuit terminals 20 in the light-emitting unit (1, 2), and the group of drive circuit terminals 20 in the light-emitting unit (2, 3) may be respectively located at the three vertices of the triangle, for example at the three vertices of the sixth triangle. The group of drive circuit terminals 20 in the light-emitting unit (1, 3), the group of drive circuit terminals 20 in the light-emitting unit (1, 4), and the group of drive circuit terminals 20 in the light-emitting units (2, 3) may be located at the three vertices of the triangle, for example at the three vertices of the seventh triangle.

The line connecting the centers of gravity of two adjacent triangles in the row direction or the column direction is parallel to the row direction or the column direction. For example, the line connecting the center of gravity of the first triangle and the center of gravity of the third triangle is parallel to the column direction. The line connecting the center of gravity of the second triangle and the center of gravity of the fourth triangle is also parallel to the column direction. The line connecting the center of gravity of the first triangle, the center of gravity of the fifth triangle, and the center of gravity of the seventh triangle is parallel to the row direction. The line connecting the center of gravity of the second triangle and the center of gravity of the sixth triangle is parallel to the row direction.

The arrangements for other groups of drive circuit terminals 20 are the same as above, which will not be repeated herein.

The arrangement of the groups of drive circuit terminals 20 corresponding to the plurality of light-emitting units 101 on the array substrate may be designed according to the above ways, and details are not described herein. In some examples, according to a specific implementation, along the row direction, the arrangement including the group of light-emitting element terminals 10 and the group of drive circuit terminals 20 corresponding to one light-emitting unit is used as a repeating unit, and the array substrate may include a plurality of repeating units. The adjacent repeating units are arranged at intervals and are periodically arranged along the row direction. In this way, one light-emitting unit may be used as a repeating unit for repeated arrangement, so as to form an array substrate. In this case, in the light-emitting units arranged along the row and column directions, the relative positions among the plurality of groups of light-emitting element terminals 10 and the groups of driving circuit terminals 20 in each light-emitting unit may be substantially the same.

Referring to FIG. 4, it is a schematic structural diagram of the group of sensor terminals 30. The group of sensor terminals 30 includes an input terminal 31 for connecting with the $R_x$ pin of the sensor, an output terminal 32 for connecting with the $T_x$ pin of the sensor, a power terminal 33 for connecting to the $V_+$ pin of the sensor, and a common voltage terminal 34 for connecting to the Gnd pin of the sensor.

Figure 5:
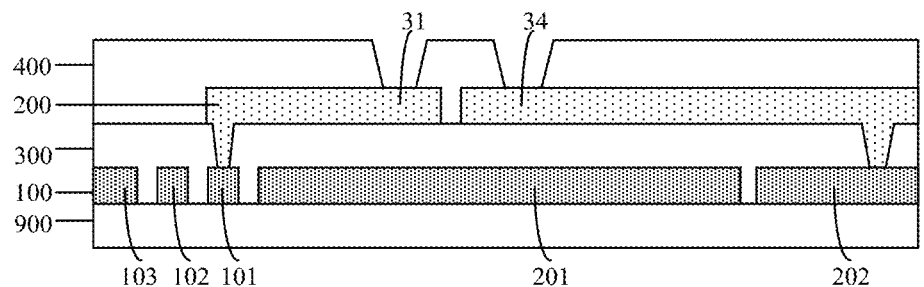
FIG. 5 is a cross-sectional schematic diagram along A-A in FIG. 4.

FIG. 5 is a schematic cross-sectional view along the direction A-A in FIG. 4. The first conductive layer 100 is provided with a first group of signal lines for driving the sensors to perform sensing. The first group of signal lines includes an input signal line 101, an output signal line 102, a power line 103, and a first common voltage signal line 104. Each of the signal lines described above extends in the column direction and is arranged in the row direction. The input terminal 31 is electrically connected to the input signal line 101, the output terminal 32 is electrically connected to the output signal line 102, the power terminal 33 is electrically connected to the power signal line 103, and the common voltage terminal 34 is electrically connected to the first common voltage signal line 104.

The first common voltage signal line 104 and the second common voltage signal line 201 are used to provide the ground voltage. Therefore, the second common voltage signal line 201 and the first common voltage signal line 104 may be combined into one signal line. In this case, a common voltage signal may be provided for the sensor and the drive circuit at the same time, without increasing the number of signal lines.

The sensor provided by embodiments of the present disclosure may be used to sense temperature. For example, the sensor includes a thermal triode, which uses the voltage change between the base and the emitter to sense the temperature change. It may further includes an analog-to-digital conversion unit to convert the analog signal indicative of the voltage change into a digital signal. Further, a signal processor such as for denoising and filtering may also be included to further process the digital signal, so that the measurement value of the corresponding temperature change obtained by converting the digital signal is more accurate. By comparing the measurement value of the temperature change with a standard value, the cause of the temperature change may be determined. For example, the cause may be a circuit problem due to the current in the area for temperature measurement, or a packaging problem in the area for temperature measurement. With adjustment or repair directed to different problems, the effect of temperature monitoring is achieved and the product yield is improved.

The group of sensor terminals 30 may be located at a gap between two adjacent light-emitting units, as shown in FIG. 2. In other embodiments, the group of sensor terminals 30 may also be located between the groups of light-emitting element terminals 10 in the light-emitting unit, as long as the area where the light-emitting unit is located can be sensed. Regardless of the arrangement, a plurality of groups of sensor terminals 30 may be arrayed on the array substrate along the row direction and the column direction, so that the sensors can monitor the temperature of the light-emitting units in different areas.

The number of the sensors is chosen according to the requirement about the sensing accuracy of the array substrate, and it may be multiple or only one. Accordingly, the number of the groups of sensor terminals 30 may be also one or more.

In an embodiment of the present disclosure, in order to achieve more accurate inspection and regulation, the number of the groups of sensor terminals 30 is multiple, and the groups of sensor terminals 30 are arranged in the gap between the light-emitting units. Taking FIG. 6 as an example, it is a schematic arrangement diagram of the group of sensor terminals 30 and signal lines. The figure schematically shows that 15 groups of sensor terminals 30 are arranged evenly on the array substrate in 3 rows and 5 columns.

Figure 6:
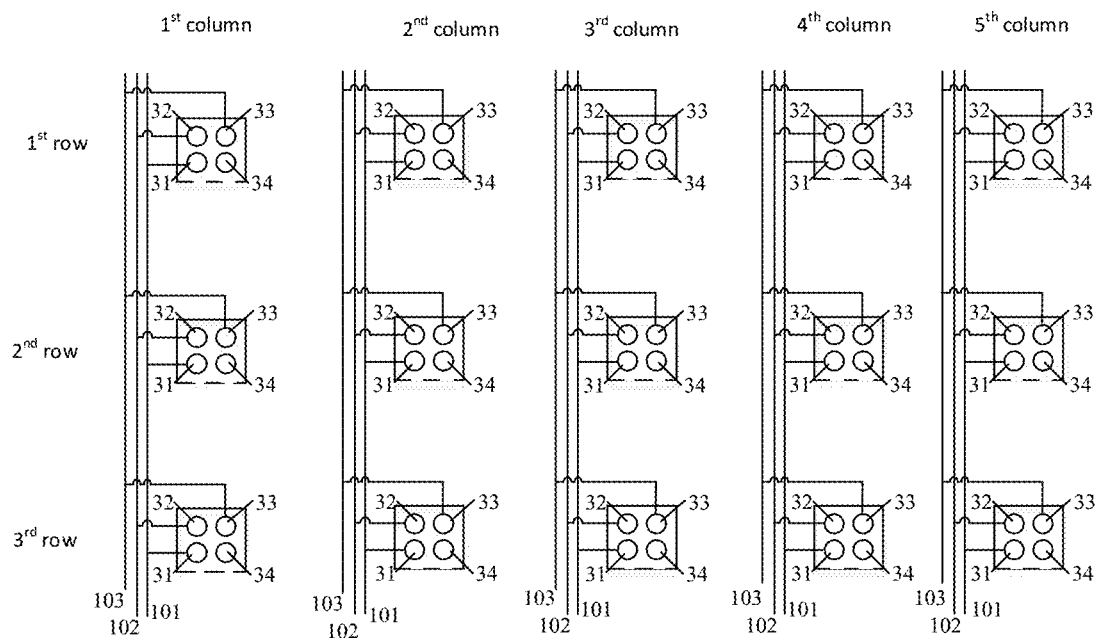
FIG. 6 is a schematic arrangement diagram of the group of sensor terminals and the signal lines.

It can be understood that the number and arrangement of the groups of sensor terminals 30 are not unique. Each sensor may sense the surrounding light-emitting elements. In order to ensure that the sensing data is helpful for monitoring the actual performance of the light-emitting elements, the number and positions of the sensors may be adjusted according to the number and range of the light-emitting elements that can be sensed by each sensor, so that the full sensing range of the sensors can cover exactly all the light-emitting elements without any repeated sensing. The groups of sensor terminals in FIG. 6 are arranged in the row and column directions. The groups of sensor terminals in each row or each column are located on the same straight line, and the interval between two adjacent groups of sensor terminals is the same, so as to make the test more accurate. In other embodiments, according to the testing requirements, the sensors in each row or each column may also be arranged in other forms. For example, the sensors in each row or each column may be not located on the same straight line, as long as the sensing purpose can be achieved.

The connection relationship among the sensors will be described below. The array substrate may have N sensors, where N is greater than or equal to 1 and is an integer.

In some cases, N sensors are cascaded with each other. That is, the $T_x$ pin of the n-th stage of sensor is connected to the $R_x$ pin of the (n+1)-th stage of sensor, the $R_x$ pin of the 1-st stage of sensor is connected to the input signal line 101, and the $T_x$ pin of the N-th stage of sensor is connected to the output signal line 102, where n is an integer greater than 1 and less than N−1. The $R_x$ pin of the 1-st stage of sensor is connected to the input signal line 101 through the input terminal 31 in the group of sensor terminals corresponding to the sensor, for receiving the input signal. The output pin $T_x$ of the N-th stage of sensor is connected to the output signal line 102 through the output terminal 32 of the corresponding group of sensor terminals, for transmitting the signal sensed by the sensor to the external circuit. The input signal is generated based on a communication protocol, for performing a series of configurations and settings for various stages of sensors. In the power-on phase, the input signal is configured to sequentially assign address information for the 1-st stage of sensor to the N-th stage of sensor. At the initial configuration phase, the input signal is configured to sequentially specify the sensing accuracy and the sensing range of the 1-st stage of sensor to the N-th stage of sensor with respect to a physical quantity (such as temperature). In the sensing phase, the input signal is configured to specify the x-th stage of sensor for performing the sensing function, and output the corresponding sensing signal. It can be understood that in the sensing phase, only one sensor performs the sensing function at a time, and the other stages of sensors may be equivalent to the (N−1) resistors connected in series with the sensor performing the sensing function. In this way, sensing is achieved at specific locations on the array substrate. Therefore, in the sensing phase, the input signal may be configured to sequentially designate the sensor at each stage to perform the sensing function, so that the sensing signals at various positions on the array substrate can be obtained.

In some cases, the N sensors may also be independent of each other. In order to avoid too many signal lines and complex overall wiring, sensors located in the same column may be connected to the same power signal line 103, the same input signal line 101, and the same output signal line 102. The $R_x$ pin of each sensor is connected to the input signal line 101 through the input terminal 31 in the group of sensor terminals corresponding to the sensor, for receiving the input signal. The output pin $T_x$ of each sensor is connected to the output signal line 102 through the output terminal 32 in the corresponding group of sensor terminals, for transmitting the signal sensed by the sensor to the external circuit. Each sensor is preset with address information, and the address information of each sensor is different. The input signal is generated based on a communication protocol for configuring and setting each sensor. In the initial configuration phase, the input signal containing address information is configured to specify the sensing accuracy and the sensing range of the corresponding sensor with respect to a physical quantity (such as temperature). In the sensing phase, the input signal containing address information is configured to specify a certain sensor for performing the sensing function and output a corresponding sensing signal. It can be understood that, in the sensing phase, only one sensor performs the sensing function at a time, and other sensors connected to the same input signal line 101 and the same output signal line 102 as the sensor performing the sensing function do not work, so that sensing at specific locations on the array substrate can be achieved. Therefore, in the sensing phase, the input signal may be configured to sequentially designate the sensors at different positions to perform the sensing function, so that the sensing signals at various positions on the array substrate can be obtained.

Figure 7:
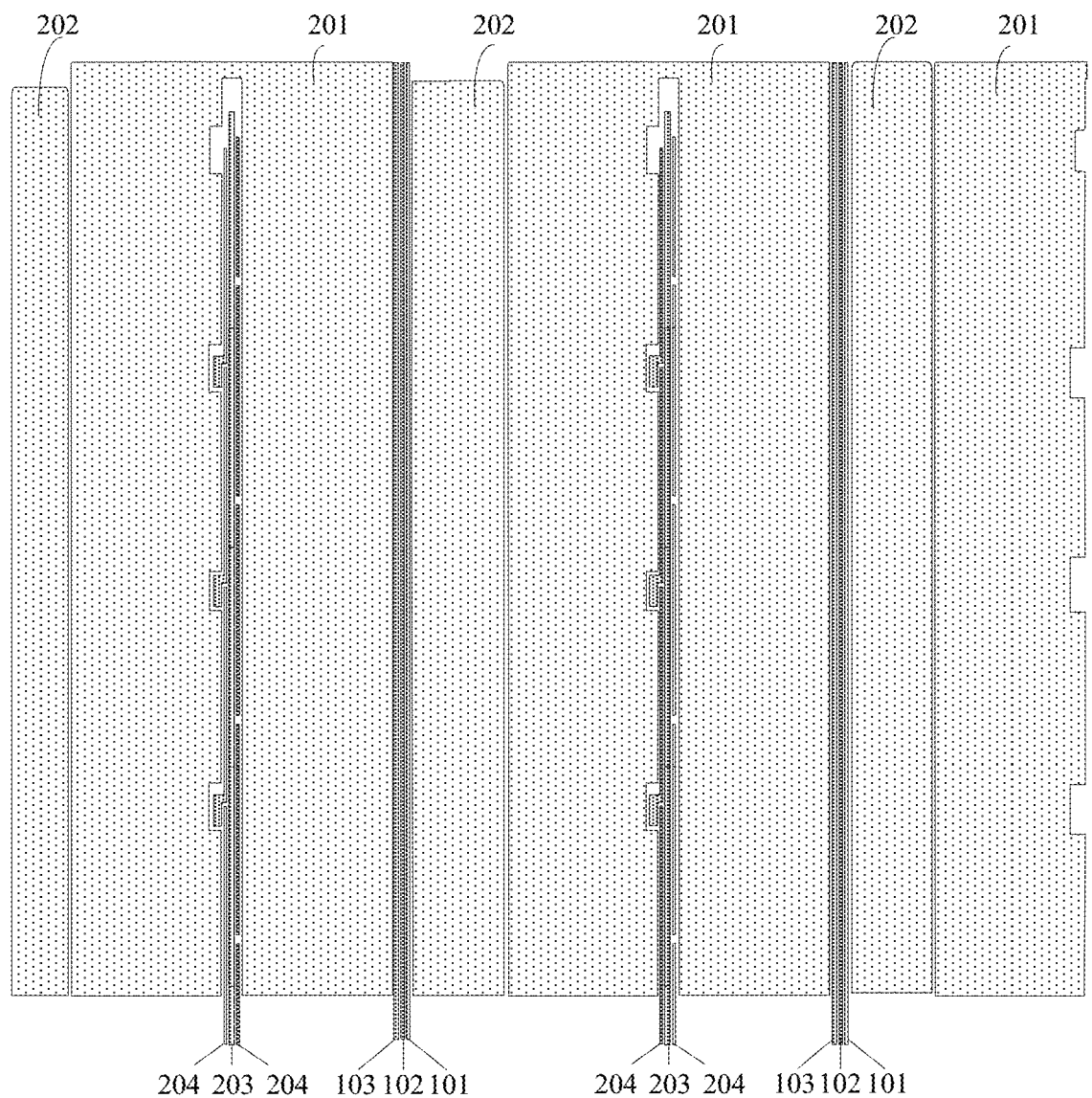
FIG. 7 shows a schematic structural diagram of the first conductive layer in FIG. 6.

In an embodiment, referring to FIGS. 1-7, FIG. 6 corresponds to the arrangement of the group of sensor terminals 30 and the signal lines in the array substrate of FIG. 1, and FIG. 7 shows the structure of the first conductive layer 100 of FIG. 6. As shown, the number of the input signal lines 101 is equal to the number of the groups of sensor terminals 30 in the row direction, and the number of the output signal lines 102 is also equal to the number of the groups of sensor terminals 30 in the row direction. In the column direction, the input terminal 31 of each group of sensor terminals 30 located in the same column is connected to the same input signal line 101, and the output terminal 32 of each group of sensor terminal 30 located in the same column is connected to the same output signal line 102. That is to say, only one input signal line 101 and one output signal line 102 are provided in each column, thereby reducing the number of the input signal lines 101 and the number of the output signal lines 102.

Figure 8:
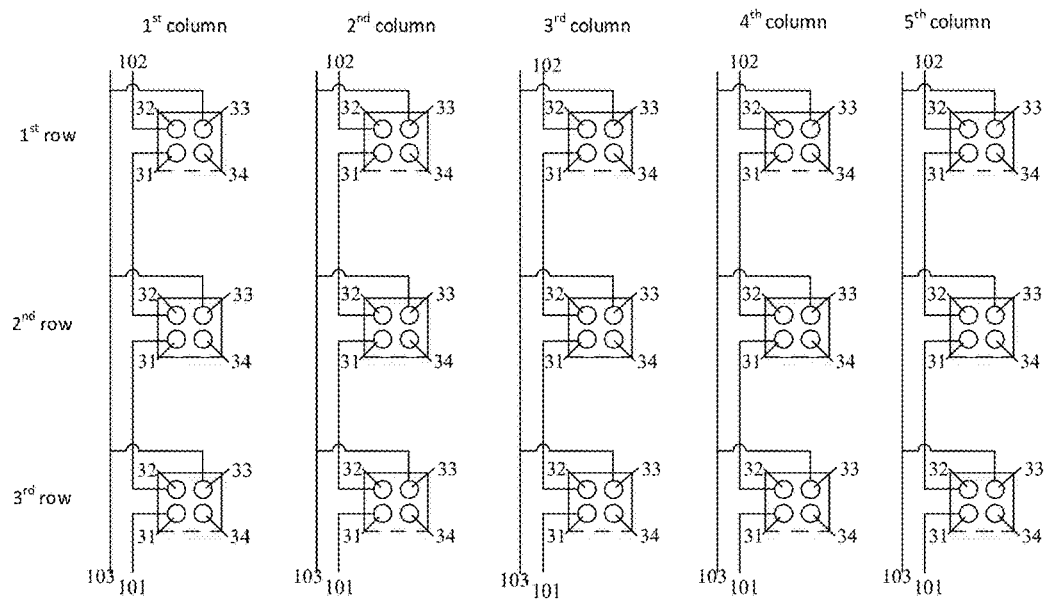
FIG. 8 shows an arrangement of the signal lines of the group of sensor terminals according to an embodiment of the present disclosure.
Figure 9:
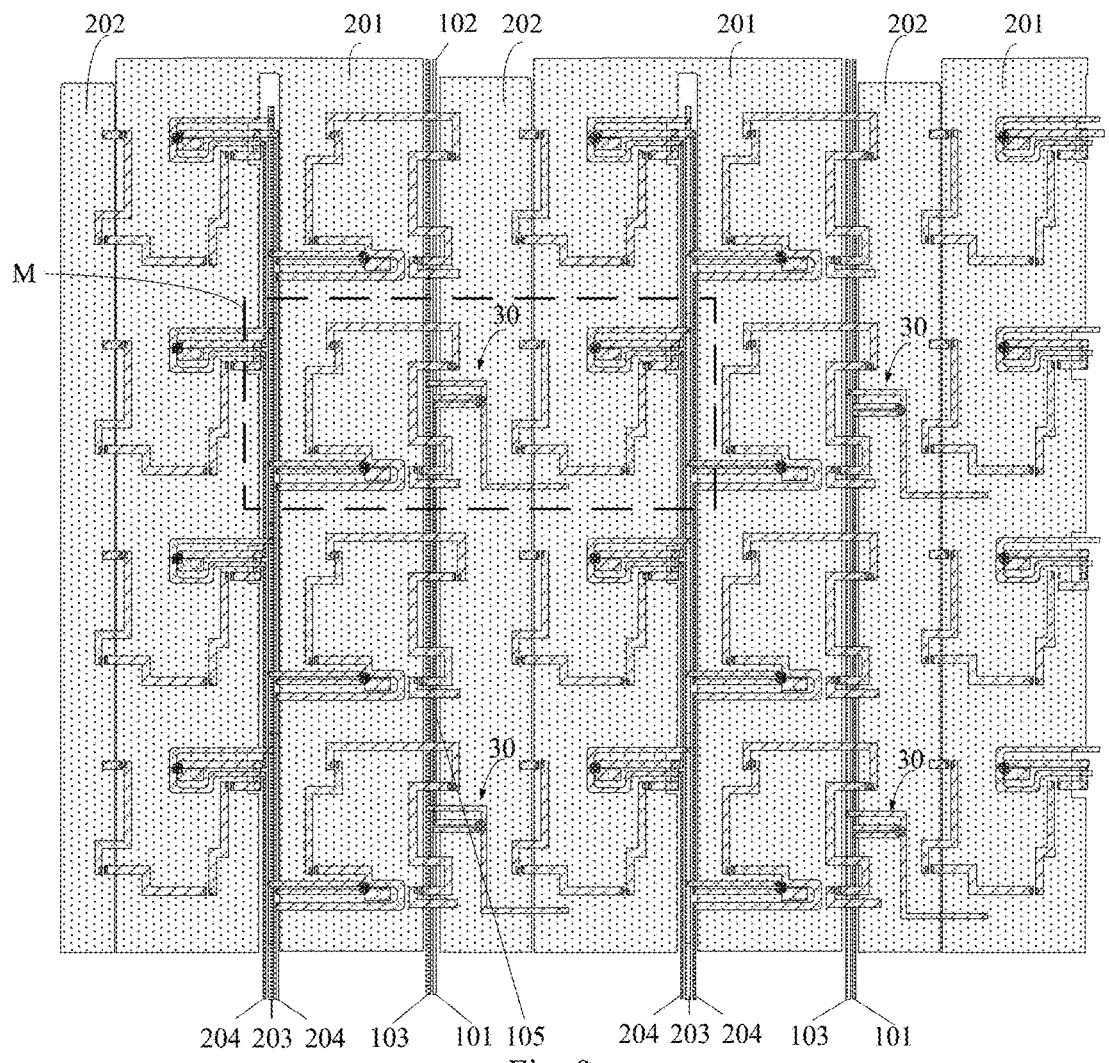
FIG. 9 shows a schematic partial structural diagram of the array substrate in FIG. 8.
Figure 10:
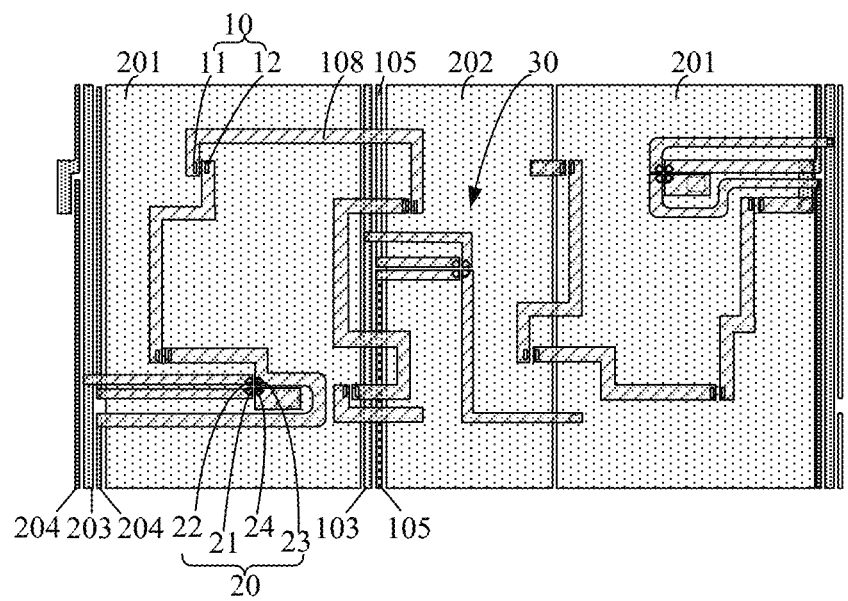
FIG. 10 is a partial enlarged schematic diagram of the M area in FIG. 9.
Figure 11:
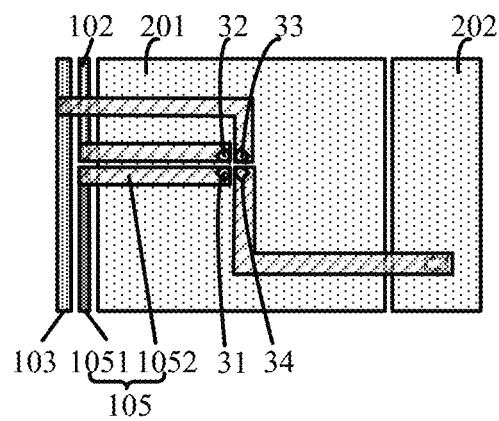
FIG. 11 is a schematic structural diagram of a group of sensor terminals in FIG. 9.
Figure 12:
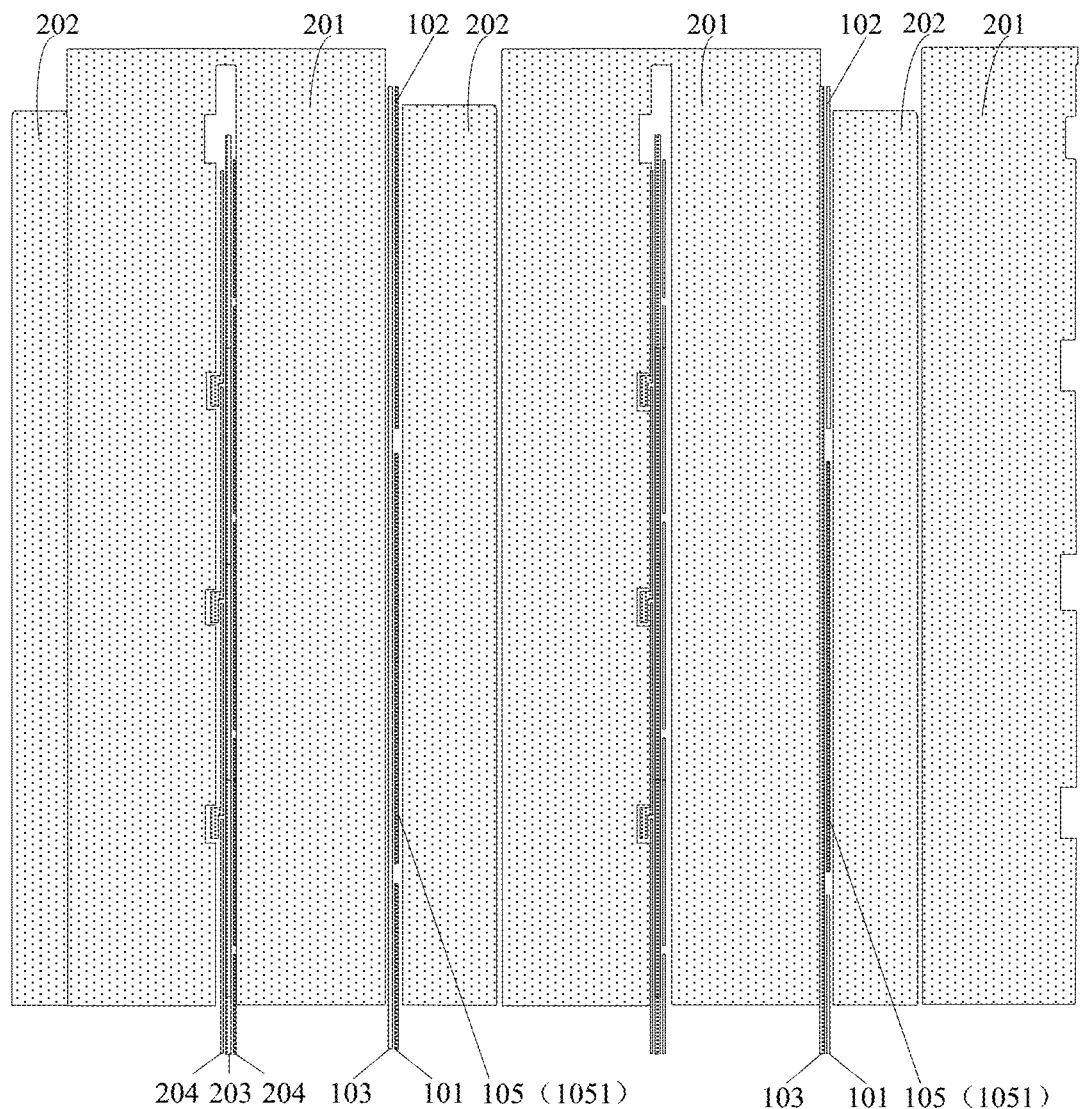
FIG. 12 shows a schematic wiring diagram of the first conductive layer in FIG. 9.

In another embodiment, referring to FIGS. 8-12, FIG. 8 shows the signal line arrangement of the group of sensor terminals 30 in an embodiment, FIG. 9 shows a partial structural schematic diagram of the array substrate in an embodiment, FIG. 10 is a partial enlarged schematic diagram of the M area in FIG. 9, FIG. 11 is a schematic structural diagram of a group of sensor terminals 30 in FIG. 9, and FIG. 12 shows the wiring of the first conductive layer 100 in FIG. 8. As shown in the figures, the number of the input signal lines 101 is equal to the number of the sensor terminals in the row direction, and the number of the output signal lines 102 is equal to the number of the sensor terminals in the row direction. In the column direction, among two adjacent groups of sensor terminals 30 located in the same column, the output terminal 32 of one group of sensor terminals 30 is electrically connected to the input terminal 31 of the other group of sensor terminals 30; and among various groups of sensor terminals 30 located in the same column, the input terminal 31 of the first group of sensor terminals 30 is connected to one input signal line 101, and the output terminal 32 of the last group of sensor terminals 30 is connected to one output signal line 102, so that all the sensors in each column are connected in series, and the signal used to configure the sensors can be transmitted to each sensor in the same column.

For example, in the structure shown in the figures, the input terminal 31 of the group of sensor terminals 30 in the bottom row and the first column is connected to the input signal line 101, and the output sub-terminal 32 thereof is connected with the input terminal 31 of the group of sensor terminals 30 in the penultimate row and the first column. The input terminal 31 of the group of sensor terminals 30 in the penultimate row and the first column is connected to the input terminal 31 of the group of sensor terminals 30 in the penultimate row and the first column. In a similar way, the output terminal 32 of the group of sensor terminals 30 in the uppermost row and the first column is connected to the output signal lines 102, so that the sensors in the first column can be connected in series. In a similar way, the groups of sensor terminals 30 in each column are connected, so that the sensors in each column can be connected in series. Based on such series connection, only one input signal line 101 and one output signal line 102 are arranged in each column. Besides, the input signal line 101 and the output signal line 102 only need to be arranged above and below the array substrate respectively, and can be routed through edge wirings to the binding area of the array substrate, without the need to penetrate the entire array substrate up and down. Compared with the wiring way shown in FIG. 5, the space occupied by the lines is further reduced.

In an embodiment, since in the two adjacent groups of sensor terminals 30, the output terminal 32 of one group of sensor terminals 30 is electrically connected to the input terminal 31 of the other group of sensor terminals 30, the second conductive layer 200 can be provided with leads for connecting the two input terminals.

Figure 13:
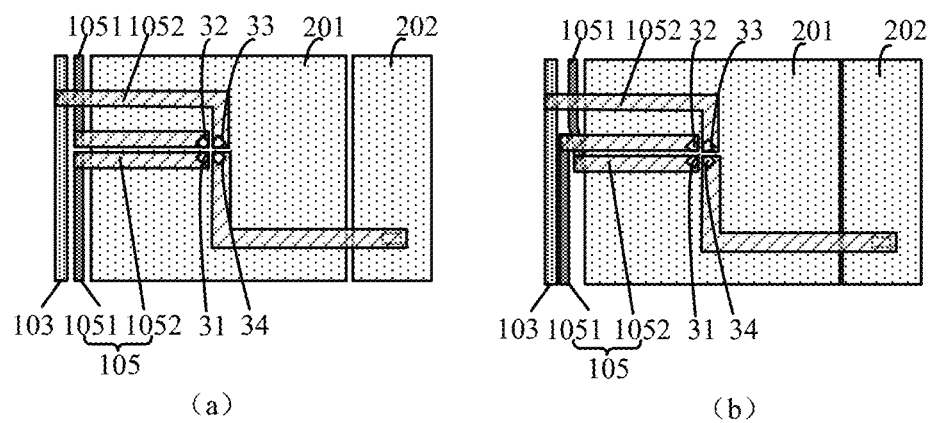
FIG. 13 shows a schematic structural diagram of the first leads.

In an embodiment, referring to FIG. 13, the array substrate further includes a plurality of first leads 105. The first leads 105 connect the output terminals and the input terminals of two adjacent groups of sensor terminals 30. The first leads 105 include first column leads 1051 extending in the column direction and first row leads 1052 extending in the row direction. Each of the first column leads 1051 is provided on the first conductive layer 100, and each of the first row leads 1052 is provided on the second conductive layer 200. The first column leads 1051 and the first row leads 1052 are electrically connected through via holes. Taking the first leads 105 as shown in the figure as an example, the first leads 105 include one first column lead 1051 and two first row leads 1052. The two first row leads 1052 extend laterally out from the output terminal and the input terminal respectively. The two first row leads 1052 are electrically connected to the longitudinal first column lead 1051 at the same time through via holes, so that the output terminals and the input terminals of two adjacent groups of sensor terminals 30 are electrically connected. FIG. 13(*a*) shows a case where the first column lead 1051 does not intersect with the first row leads 1052, and FIG. 13(*b*) shows a case where the first column lead 1051 intersects with the first row leads 1052.

In an embodiment, the first column leads 1051 connected to the groups of sensor terminals 30 located in the same column are arranged along the column direction, so that all the first column leads 1051 occupy the least space in the column direction.

Figure 14:
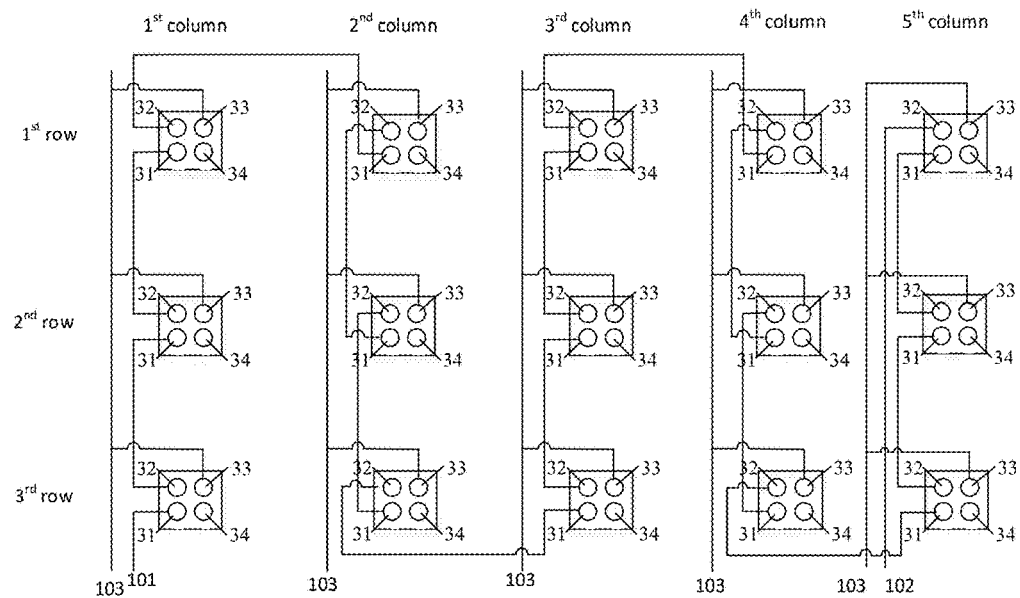
FIG. 14 shows the arrangement of the signal lines of the group of sensor terminals according to still another embodiment of the present disclosure.
Figure 15:
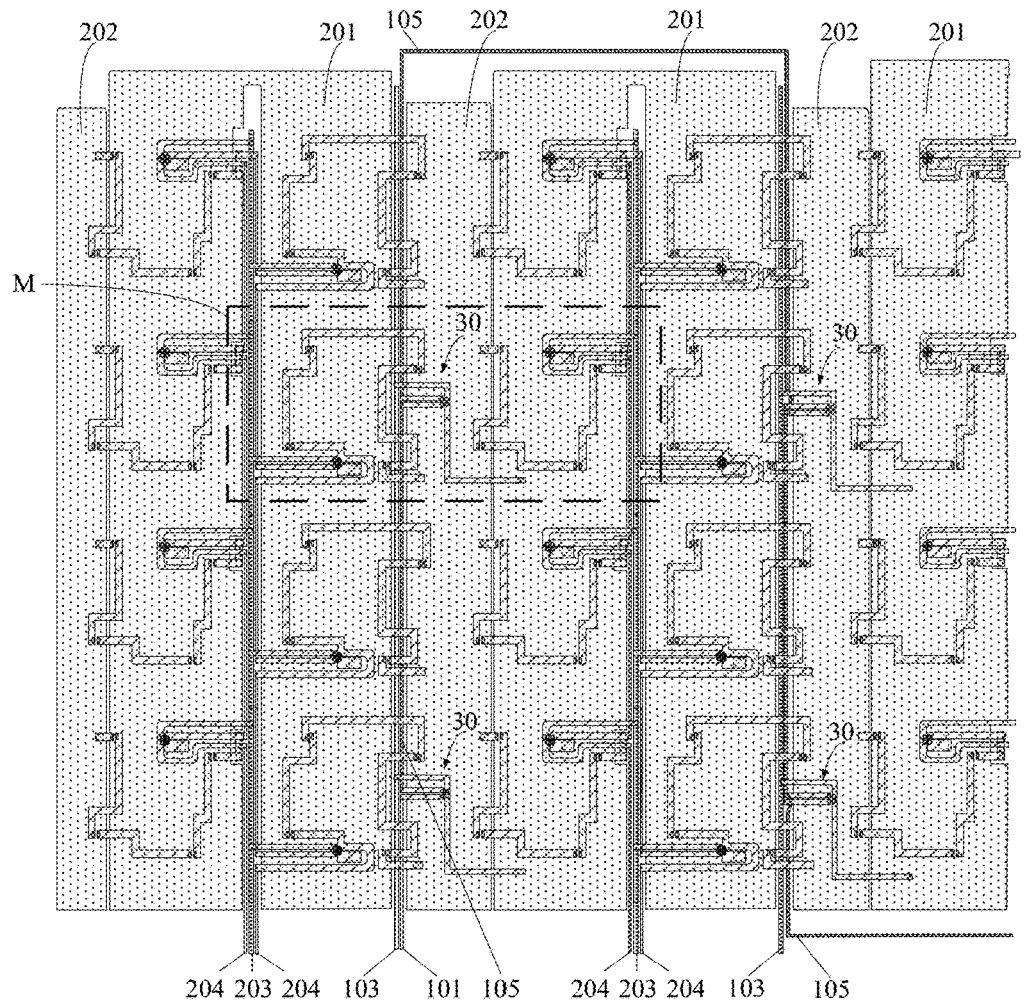
FIG. 15 shows a schematic partial structural diagram of the array substrate in FIG. 14.
Figure 16:
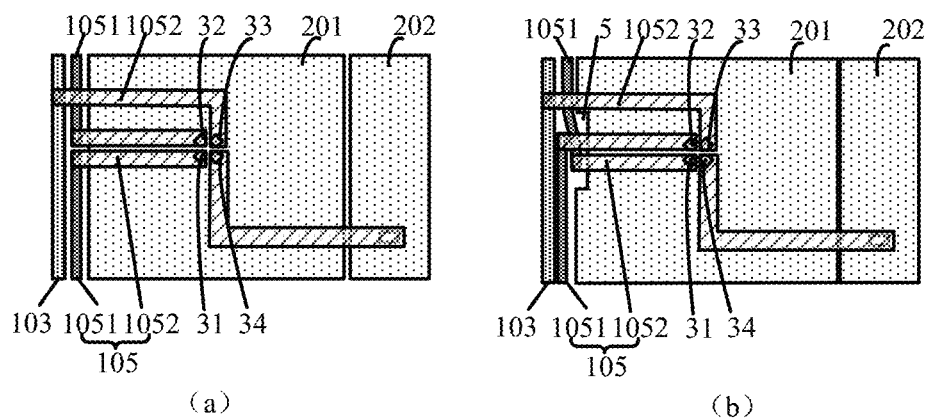
FIG. 16 is a schematic structural diagram of a group of sensor terminals in FIG. 14.
Figure 17:
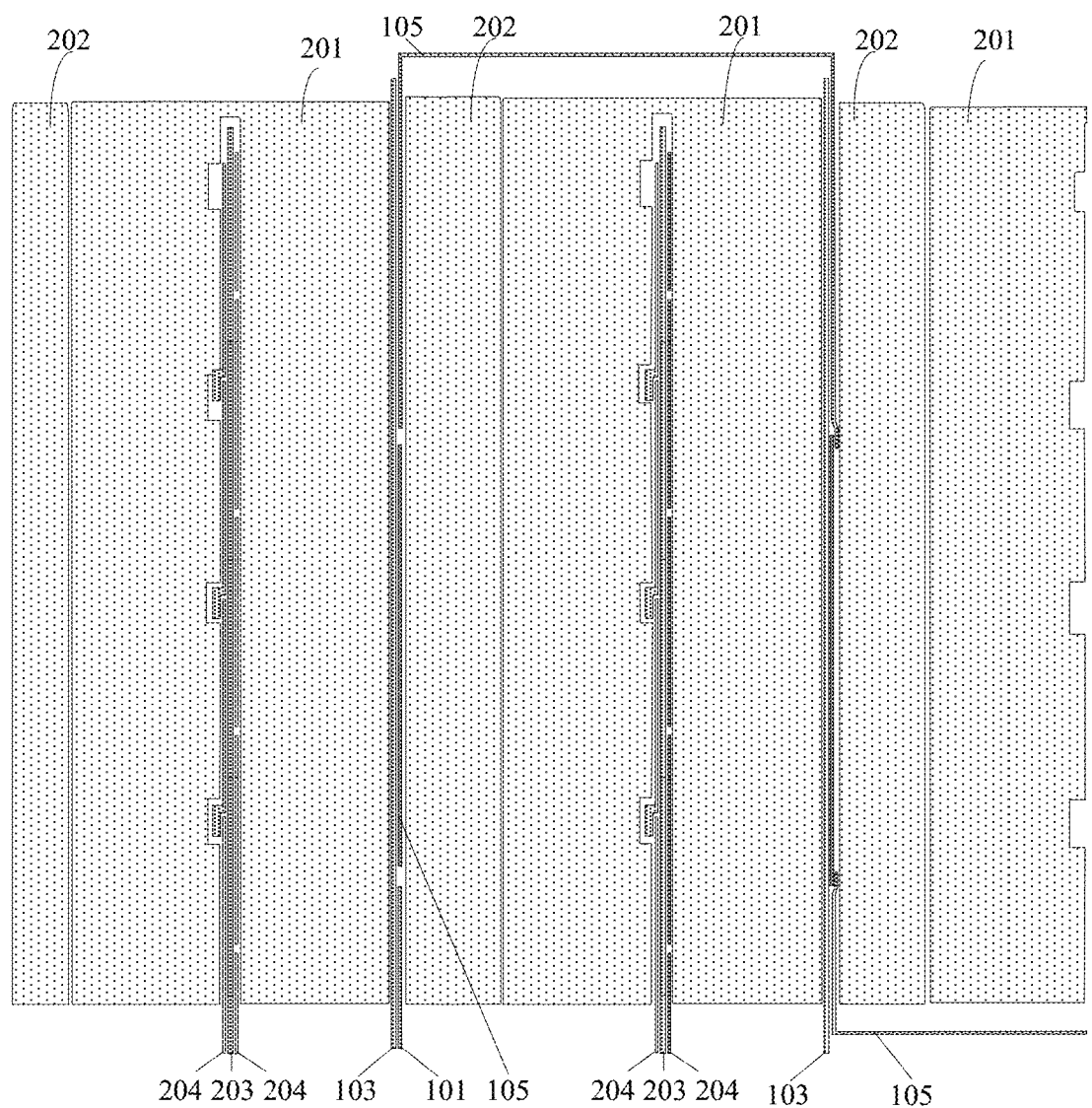
FIG. 17 shows the wiring of the first conductive layer in FIG. 14.

In yet another embodiment, referring to FIGS. 14-17, FIG. 14 shows the signal line arrangement of the group of sensor terminals 30 in an embodiment, and FIG. 15 shows a schematic partial structural diagram of the array substrate in an embodiment. The schematic partial enlarged diagram in FIG. 15 is the same as that in FIG. 10. Besides, FIG. 16 is a schematic structural diagram of a group of sensor terminals 30 in FIG. 14, and FIG. 17 shows the wiring of the first conductive layer 100 in FIG. 14. As shown in the figures, the number of the input signal lines 101 and the number of the output signal lines 102 are both one. In the column direction, among two adjacent groups of sensor terminals 30 located in the same column, the output terminal 32 of one group of sensor terminals 30 is electrically connected to the input terminal 31 of the other group of sensor terminals 30. That is, all the sensors in each column are connected in series. Further, among the groups of sensor terminals 30 in two adjacent columns, the output terminal 32 of the group of sensor terminals 30 located in one column and the first row or the last row is electrically connected to the input terminal 31 of the group of sensor terminals 30 located in the other column and the first row or the last row, so that all the sensors are connected in series. Among all the groups of sensor terminals 30 connected in series, the input terminal 31 of the first group of sensor terminals 30 is connected to the input signal line 101, and the output terminal 32 of the last group of sensor terminals 30 is connected to the output signal line 102, so that the signal used to configure the sensors is transmitted to all the sensors on the array substrate.

Figure 18:
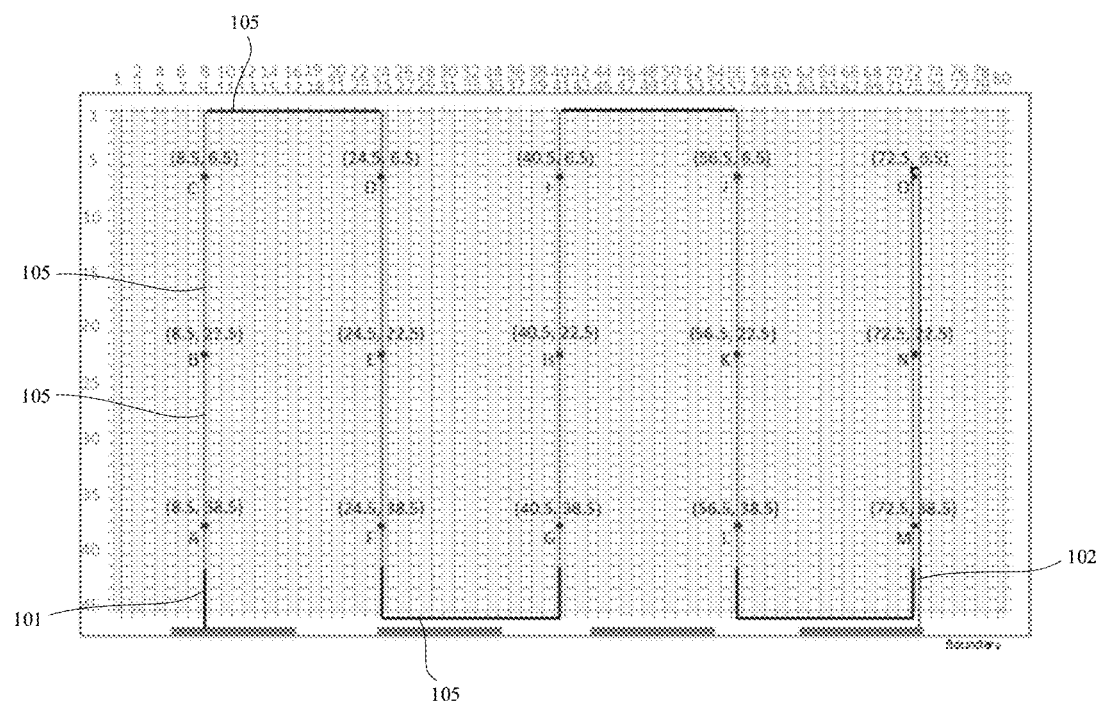
FIG. 18 shows a schematic diagram of the transmission path for the input signal and the output signal in FIG. 14.

FIG. 17 shows a schematic diagram of the transmission paths of the input signals and the output signals according to an embodiment of the present disclosure, and FIG. 18 schematically shows a structure where 15 groups of sensor terminals 30 are arranged in an array on the array substrate in 3 rows and 5 columns. The 15 points A, B, C, . . . , M, N, O represent 15 sensors respectively. Each small square in the figures represents a light-emitting unit, each small square on the abscissa represents a column of light-emitting units, and each small square on the ordinate represents a row of light-emitting units. All the light-emitting units are arranged in an array in rows and columns. The orthographic projections of the group of sensor terminals 30 and the light-emitting units on the base substrate do not overlap. The coordinate values next to each letter in FIG. 18 are used to indicate the positions of the terminal sensors on the array substrate. For example, A (8.5, 38.5) indicates that the sensor terminal A is located between the 8-th and 9-th columns of light-emitting units, and is further located between the 38-th and 39-th rows of light-emitting units.

In some embodiments, the m×n sensors are sequentially connected in series in an S-shape column by column and row by row. Alternatively, the m×n sensors are sequentially numbered column by column and row by row in a Z-shape. For example, as shown in FIG. 18, when m=3 and n=5, sensor A is connected to the input signal line 101 through the input terminal 31 of the corresponding group of sensor terminals 30. Then, sensor A and the sensors located in the same column are sequentially connected in series. For example, sensor A, sensor B, and sensor C are connected sequentially in series. After that, sensor C is connected in series with the most adjacent sensor D in the same row. Sensor D is connected sequentially in series with each sensor in the same column. For example, sensor D, sensor E, and sensor F are connected sequentially in series, and so on. Sensor O is connected to the output signal line 102 through the output terminal 32 of the corresponding group of sensor terminals 30, so as to realize the series connection of the 15 groups of sensors 30. Based on such series connection, a minimum of one input signal line 101 and one output signal line 102 need to be arranged on the array substrate. Besides, the input signal line 101 and the output signal line 102 only need to be respectively connected with the first and last sensors among various sensors with a series connection relationship, without the need to penetrate through the entire array substrate up and down. Compared with the connection between the groups of sensor terminals corresponding to multiple sensors and the signal lines as shown in FIG. 6, the series connection can greatly reduce the number of the signal lines, thereby saving the wiring space of the array substrate. In an embodiment, since in two adjacent groups of sensor terminals 30, the output terminal 32 of one group of sensor terminals 30 is electrically connected to the input terminal 31 of the other group of sensor terminals 30, the second conductive layer 200 can be provided with lead for connecting the two terminals.

In an embodiment, referring to FIG. 16, the array substrate further includes a plurality of first leads 105. The first leads 105 connect the output sub-terminals and the input sub-terminals of two adjacent groups of sensor terminals 30. The first leads 105 include first column leads 1051 extending in the column direction and first row leads 1052 extending in the row direction. Each of the first column leads 1051 is provided on the first conductive layer 100, and each of the first row leads 1052 is provided on the second conductive layer 200. The first column leads 1051 and the first row leads 1052 are electrically connected through via holes. Taking the first leads 105 as shown in the figures as an example, the first leads 105 include one first column lead 1051 and two first row leads 1052. The two first row leads 1052 are respectively extend out from the output sub-terminal and the input sub-terminal laterally. The two first row leads 1052 are electrically connected to the longitudinal first column lead 1051 at the same time through via holes, so that the output terminals 32 and the input terminals 31 of two adjacent groups of sensor terminals 30 are electrically connected. FIG. 16(*a*) shows a case where the first column lead 1051 does not intersect with the first row leads 1052, and FIG. 16(*b*) shows a case where the first column lead 1051 intersects with the first row leads 1052.

In an embodiment, the first column leads 1051 connected to the groups of sensor terminals 30 located in the same column are arranged along the column direction, so that all the first column leads 1051 occupy the least space in the column direction.

Referring to FIGS. 6, 8 and 14, in some embodiments of the present disclosure, the number of the power signal lines 103 is equal to the number of the sensor terminals in the row direction; and in the column direction, the power terminal of each group of sensor terminals 30 located in the same column 33 is connected to the same power signal line 103, thereby reducing the number of the power signal lines 103. Since the power signal lines 103 extend in the column direction, the power terminals 33 and the power signal lines 103 may be connected by providing lateral leads on the second conductive layer 200. In the structures shown by FIG. 7, FIG. 12 and FIG. 17, the power signal lines 103 and the first column leads 1051 are arranged side by side, and a sufficient distance may be reserved between them, so as to avoid mutual signal interference.

Similarly, referring to FIG. 6, FIG. 8, and FIG. 14, in some embodiments of the present disclosure, the number of the first common voltage signal lines 104 is equal to the number of the groups of sensor terminals 30 in the row direction; and in the column direction, the common voltage terminal 34 of each group of sensor terminals 30 located in the same column is connected to the same first common voltage signal line 104 (i.e., the second common voltage signal line 201), thereby reducing the number of the common voltage signal lines.

Figure 19:
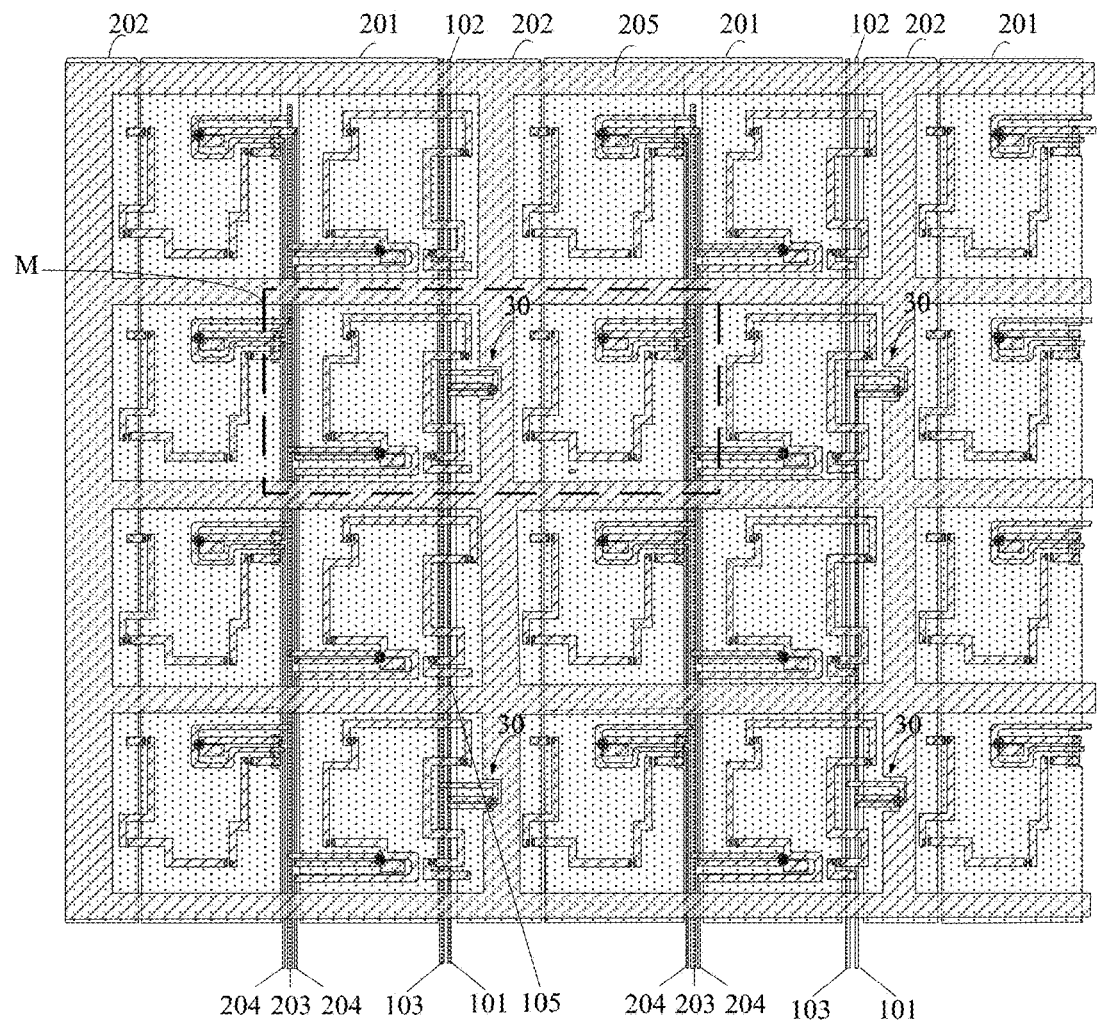
FIG. 19 shows a schematic partial structural diagram of an array substrate according to yet another embodiment of the present disclosure.
Figure 20:
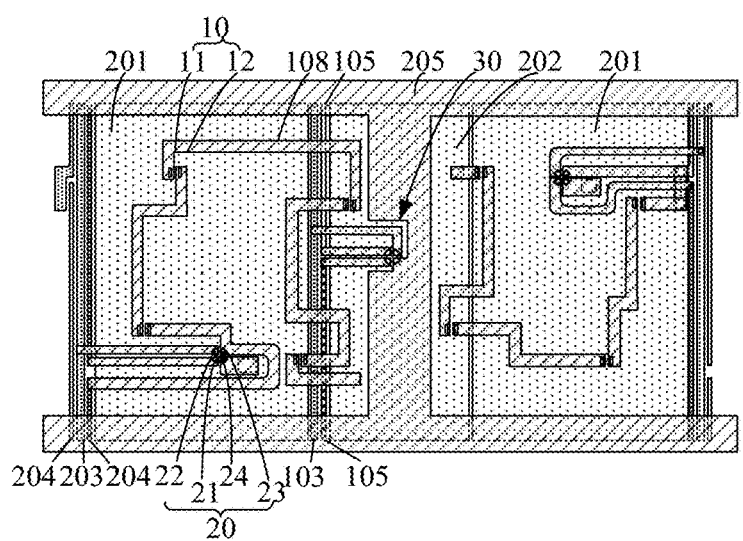
FIG. 20 is a partial enlarged schematic diagram of M area in FIG. 19.
Figure 21:
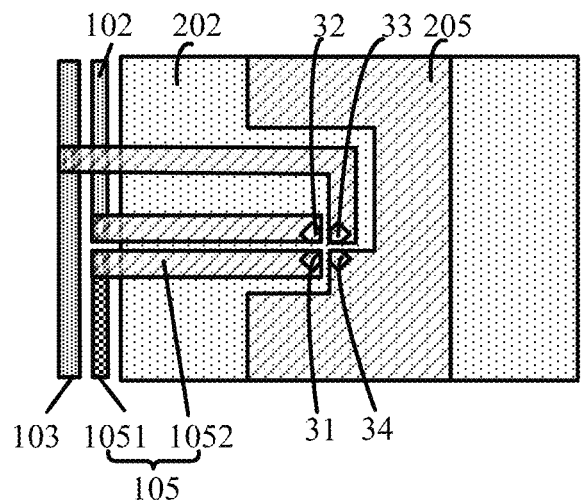
FIG. 21 is a schematic structural diagram of a group of sensor terminals in FIG. 19.

In an embodiment, the array substrate further includes a common voltage signal auxiliary line 205 disposed on the second conductive layer 200. The common voltage signal auxiliary line 205 is electrically connected to the first common voltage signal line through a via hole, so as to increases the signal transmission path by two layers of wiring and improves the signal transmission strength. Referring to FIGS. 19-21, FIG. 19 shows a schematic partial structural diagram of the array substrate in an embodiment, FIG. 20 is a partial enlarged schematic diagram of the M area in FIG. 19, and FIG. 21 is a schematic structural diagram of a group of sensor terminals 30 in an embodiment. The figures exemplarily show a wiring way of the common voltage signal auxiliary line 205. The common voltage signal line is in a grid shape and covers the gap between adjacent light-emitting units. In the thickness direction of the array substrate, the common voltage signal auxiliary line 205 according to an embodiment is located above the drive voltage signal line 202. Since both the sensor terminal and the common voltage signal auxiliary line 205 are located on the second conductive layer 200, the common voltage sub-terminal 34 may be directly connected to the common voltage signal auxiliary line 205. In other embodiments, the common voltage signal auxiliary line 205 may also have other shapes, which are not specifically limited in embodiments of the present disclosure.

The groups of terminals 30 having the above structures and the signal lines connected thereto need to occupy the wiring space of the array substrate. In an embodiment, the orthographic projections of the group of sensor terminals 30, the group of light-emitting element terminals 10, and the group of drive circuit terminals 20 on the base substrate at least partially overlap with the orthographic projection of the second group of signal lines on the base substrate, so as to save the wiring space. Further, the orthographic projection of the group of sensor terminals 30 on the base substrate, and the orthographic projection of the group of light-emitting element terminals 10 and the group of drive circuit terminals 20 on the base substrate, are respectively located in the orthographic projections on the base substrate of different signal lines in the second group of signal lines. Specifically, according to embodiments shown in FIG. 1, FIG. 9, and FIG. 15, the orthographic projection on the base substrate 900 of the group of light-emitting element terminals 10 occupying most of the space overlaps with the orthographic projection on the base substrate 900 of the wider second common voltage signal line 201; the orthographic projection on the base substrate 900 of the group of drive circuit terminals 20 also overlaps with the orthographic projection on the base substrate 900 of the second common voltage signal line 201; and the orthographic projection on the base substrate 900 of the group of sensor terminals 30 overlaps with the orthographic projection on the base substrate 900 of the drive voltage signal line 202. As a result, the wiring space can be saved.

For the above-mentioned input signal line 101, output signal line 102, power signal line 103, and first lead 105, each signal line corresponding to the groups of sensor terminals 30 in each column is located between a second common voltage signal line 201 and a drive voltage signal line 202. In order to utilize the existing space for wiring as much as possible, the edge of the second common voltage signal line 201 or the drive voltage signal line 202 may be properly slotted. If there are at least two signal lines extending in the column direction and being adjacent in the column direction, and their orthographic projections on any line parallel to the column direction share an overlapping area, the position of the slot may correspond to the overlapping area. Therefore, a larger wiring space can be obtained for the at least two adjacent signal lines, thereby improving the utilization rate of the substrate. Referring to FIG. 16(*b*), it can be understood that since the orthographic projections of the two adjacent first column leads 1051 extending longitudinally on any line parallel to the column direction share an overlapping area, the two first column leads 1051 have a wider dimension (including the line width of a single first column lead 1051 and the spacing in the row direction between adjacent first column leads 1051) in the row direction occupied by the portion corresponding to the overlapping area. The groove 5 is provided on the left side of the second common voltage signal line 201 (i.e., the position corresponding to the above-mentioned overlapping area), so that the portion corresponding to the overlapping area of the two first column leads 1051 can correspond to a larger space in the row direction. The shape of the groove 5 includes but is not limited to the rectangle as in the figures. The size or position of the groove 5 may be chosen according to the size or wring of each signal line or lead, which is not specifically limited in the present application.

Figure 23:
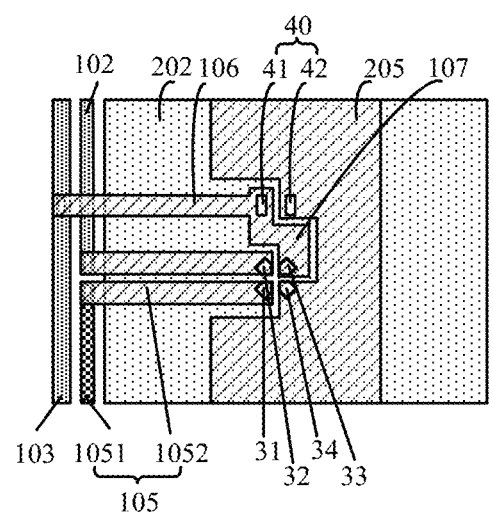
FIG. 23 is a schematic structural diagram of the group of capacitor terminals.

In an embodiment, referring to FIG. 23, the array substrate further includes a plurality of groups of capacitor terminals 40. The groups of capacitor terminals 40 are disposed on the second conductive layer 200 for binding capacitors. The groups of capacitor terminals 40 includes a first capacitor terminal 41 and a second capacitor terminal 42. The first capacitor terminal 41 and the power terminal 33 are connected to each other. The second capacitor terminal 42 and the common voltage terminal 34 are connected to each other, thereby reducing the noise generated by the sensor and making the overall electrical performance of the array substrate to be more stable.

Figure 22:
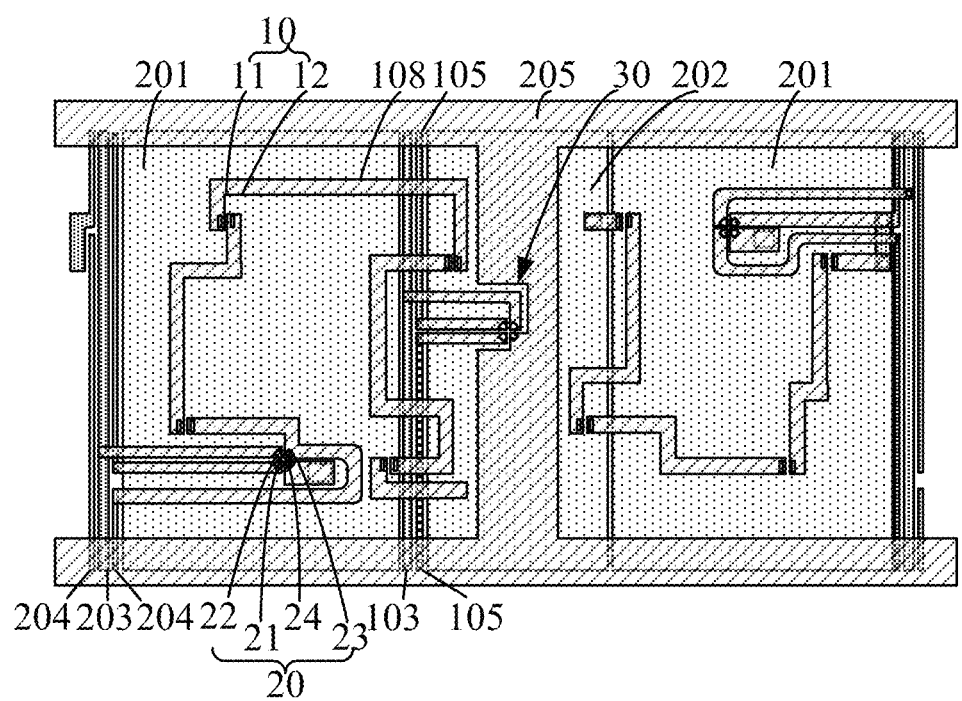
FIG. 22 is a partial enlarged schematic view of the M area including the group of capacitor terminals in FIG. 19.

FIG. 22 is a partial enlarged schematic view of the M area including the group of capacitor terminals 40 in FIG. 18, and FIG. 23 is a schematic structural diagram of the group of capacitor terminals 40. The array substrate further includes a second lead 106 and a third lead 107 disposed on the second conductive layer 200. One end of the second lead 106 is connected to the first capacitor terminal 41, and the other end of the second lead 106 is connected to the power signal line 103 through a via hole. One end of the third lead 107 is connected to the first capacitor terminal 41, and the other end of the third lead 107 is connected to the power terminal 33 of the group of sensor terminals 30.

As shown in FIG. 23, in an embodiment, since the common voltage signal auxiliary line 205 is disposed on the second conductive layer 200, the common voltage terminal 34 is directly connected to the common voltage signal auxiliary line 205. Therefore, the second capacitor terminal 42 in the group of capacitor terminals 40 is also connected to the common voltage signal auxiliary line 205, that is, electrically connected to the first common voltage signal line 104. Thus, the static electricity generated near the capacitor can be transmitted to the common voltage signal line, so as to avoid electrostatic discharge damage to the array substrate. It should be noted that the common voltage terminal 34, the second capacitor terminal 42, and the common voltage signal auxiliary line are all arranged on the second conductive layer 200. It can be understood that the common voltage signal auxiliary line 25 and other signal lines provided on the second conductive layer 200 need to be covered by an insulation layer, for preventing the lines from oxidizing and affecting the electrical performance. Besides, the upper surfaces of the terminals on the second conductive layer need to be electrically connected to peripheral components, so they are exposed. Therefore, the common voltage terminal 34 and the second capacitor terminal 42 may also be regarded as part of the common voltage signal auxiliary line 205.

It should be noted that "extending along the row direction" and "extending along the column direction" in the present disclosure both refer to the overall direction of the signal line along the row direction or the column direction, which may allow local bending or inclination within the processing error range for the purpose of avoiding other circuit structures, and is not limited to a standard straight line.

The array substrate provided by an embodiment of the present disclosure may be used as a substrate with a light-emitting function by mounting a light-emitting device thereon, and may be further applied into a display device as a backlight unit.

After the light-emitting elements, sensor, and drive chips are mounted on the array substrate according to an embodiment of the present disclosure, hemispherical microstructures may be fabricated on the light-emitting elements, sensors, and drive chips, so as to protect the above-mentioned structures and prevent them from being scratched during production and transportation. Specifically, the microstructure above the light-emitting elements is a light-transmissive material, which may further have optical shaping effects on the output light from the light-emitting elements such as improving the light efficiency or increasing the light output from the front view. Besides, the microstructure above the sensors and the drive chips may adopt the transparent materials or a material with a light absorbing effect, which is not limited herein.

Embodiments of the present disclosure further provide a display device including the array substrate in any of the above-mentioned embodiments. Since the display device includes the above-mentioned array substrate, it has the same beneficial effects, and details are not described herein again in the present disclosure.

The present disclosure does not specifically limit applications of the display device, which may be products or components with the flexible display function, such as TVs, notebook computers, tablet computers, wearable display devices, mobile phones, vehicle-mounted displays, navigation devices, e-books, digital photo frames, advertising light boxes, etc.

Other implementations provided by the disclosed examples will readily occur to those skilled in the art upon consideration of the present specification and practice of the content disclosed herein. The present application is intended to cover any modifications, uses or adaptations provided by embodiments of the present disclosure that follow the general principle provided by embodiments of the present disclosure and include those common knowledge or conventional technical means in the technical field not disclosed by the present disclosure. The specification and examples are to be regarded as exemplary only, with the true scope and spirit of embodiments of the present disclosure being indicated by the appended claims.

The invention claimed is:

1. An array substrate, comprising:
   a base substrate;
   a first conductive layer located above the base substrate and a second conductive layer located above the first conductive layer, the first conductive layer and the second conductive layer being insulated from each other;
   a plurality of groups of light-emitting element terminals, arranged in an array on the second conductive layer for coupling with light-emitting elements;
   a plurality of groups of sensor terminals, arranged on the second conductive layer for coupling with sensors, wherein no overlap exists between an orthographic projection of the groups of sensor terminals on the base substrate and an orthographic projection of the groups of light-emitting element terminals on the base substrate;
   a first group of signal lines, disposed on the first conductive layer and electrically connected to the groups of sensor terminals for driving the sensors to sense; and
   a second group of signal lines, disposed on the first conductive layer and electrically connected to the group of light-emitting element terminals for driving the light-emitting elements to emit light.

2. The array substrate according to claim 1, wherein
   each group of sensor terminals comprises an input terminal, an output terminal, a power terminal, and a common voltage terminal, wherein each sensor comprises an input pin, an output pin, a power pin, and a common voltage pin, the input terminal is configured for electrical connection with the input pin, the output terminal is configured for electrical connection with the output pin, the power terminal is configured for electrical connection with the power pin, and the common voltage terminal is configured for electrical connection with the common voltage pin;
   the first group of signal lines comprises input signal lines, output signal lines, power signal lines, and first common voltage signal lines; and
   the input terminal is electrically connected to the input signal lines, the output terminal is electrically connected to the output signal lines, the power terminal is electrically connected to the power signal lines, and the common voltage terminal is electrically connected to the first common voltage signal lines.

3. The array substrate of claim 2, wherein the plurality of groups of sensor terminals is uniformly arranged in an array along a row direction and a column direction.

4. The array substrate of claim 3, wherein
   a number of the input signal lines and a number of the output signal lines are both 1;
   in the column direction, among two adjacent groups of sensor terminals located in the same column, the output terminal of one group of sensor terminals is electrically connected to the input terminal of the other group of sensor terminals; and among the groups of sensor terminals located in two adjacent columns, the output terminal of the group of sensor terminals located in one column and the first row or the last row is electrically connected with the input terminal of the group of sensor terminals located in the other column and the first row or the last row, such that all the sensors are connected in series; and among all the groups of sensor terminals connected in series, the input terminal of the group of sensor terminals at one end is connected to the input signal lines, and the output terminal of the group of sensor terminals at the other end is connected to the output signal lines.

5. The array substrate according to claim 4, wherein
in the first group of signal lines, a number of the power signal lines is equal to a number of sensor terminals in the row direction; and
in the column direction, the power terminal of each group of sensor terminals located in the same column is connected to the same power signal line.

6. The array substrate according to claim 4, wherein
in the first group of signal lines, a number of the first common voltage signal lines is equal to a number of the groups of sensor terminals in the row direction; and
in the column direction, the common voltage terminal of each group of sensor terminals located in the same column is connected to the same first common voltage signal line.

7. The array substrate according to claim 4, wherein
the array substrate further comprises a plurality of first leads, the first leads being connected to the output terminals and the input terminals of two adjacent groups of sensor terminals; and
the first leads comprises first column leads extending along the column direction and first row leads extending along the row direction, wherein each of the first column leads is provided on the first conductive layer, each of the first row leads is provided on the second conductive layer, and the first column leads and the first row leads are electrically connected through via holes.

8. The array substrate according to claim 7, wherein the first column leads connected to each group of sensor terminals located in the same column are arranged at intervals along the column direction.

9. The array substrate according to claim 3, wherein
in the first group of signal lines, a number of the input signal lines is equal to a number of sensor terminals in the row direction, and a number of the output signal lines is equal to a number of sensor terminals in the row direction; and
in the column direction, in two adjacent groups of sensor terminals located in the same column, the output terminal of one group of sensor terminals is electrically connected with the input terminal of the other group of sensor terminals; and among the groups of sensor terminals located in the same column, the input terminal of the first group of sensor terminals is connected to one of the input signal lines, and the output terminal of the last group of sensor terminals is connected to one of the output signal lines, such that all the sensors located in each column are connected in series.

10. The array substrate according to claim 3, wherein
in the first group of signal lines, a number of the input signal lines is equal to a number of the groups of sensor terminals in the row direction, and a number of the output signal lines is equal to a number of the groups of sensor terminals in the row direction; and
in the column direction, the input terminal of each group of sensor terminals located in the same column is connected to the same input signal line, and the output terminal of each group of sensor terminals located in the same column is connected to the same output signal line.

11. The array substrate according to claim 2, wherein the array substrate further comprises:

a plurality of groups of capacitor terminals, arranged on the second conductive layer for binding capacitors, wherein each group of capacitor terminals comprises a first capacitor terminal and a second capacitor terminal, the first capacitor terminal is connected to the power terminal, and the second capacitor terminal is connected to the common voltage terminal.

12. The array substrate according to claim 11, further comprising a second lead and a third lead provided on the second conductive layer, wherein
the second lead is connected to the first capacitor terminal and the power signal lines, and
the third lead is connected to the first capacitor terminal and the power terminals of the groups of sensor terminals.

13. The array substrate according to claim 2, wherein
the second group of signal lines comprises second common voltage signal lines, drive voltage signal lines, source power lines, and source address lines; and
the second common voltage signal lines are re-used as the first common voltage signal lines.

14. The array substrate according to claim 13, wherein an orthographic projection of the groups of sensor terminals on the base substrate at least partially coincides with an orthographic projection of the second group of signal lines on the base substrate.

15. The array substrate according to claim 14, wherein an orthographic projection of the groups of sensor terminals on the base substrate and an orthographic projection of the groups of light-emitting element terminals on the base substrate are respectively located in orthographic projections on the base substrate of different signal lines in the second group of signal lines.

16. The array substrate according to claim 13, wherein each input signal line, each output signal line, and each power signal line are located between one of the second common voltage signal lines and one of the drive voltage signal lines.

17. The array substrate according to claim 13, wherein the array substrate further comprises common voltage signal auxiliary lines disposed on the second conductive layer, the common voltage signal auxiliary lines being electrically connected to the first common voltage signal lines through via holes.

18. The array substrate according to claim 13, wherein
the array substrate further comprises a fourth lead provided on the second conductive layer, the fourth lead connecting the plurality of groups of light-emitting element terminals in sequence, such that the plurality of light-emitting elements are connected in series to form a light-emitting unit; and
each group of sensor terminals is located at a gap between two adjacent light-emitting units, or each group of sensor terminals is located between the groups of light-emitting element terminals in each light-emitting unit.

19. A light-emitting substrate, comprising:
an array substrate;
light-emitting elements, coupled to the groups of light-emitting element terminals of the array substrate; and
sensors, coupled to the groups of sensor terminals of the array substrate,
wherein the array substrate comprises:
a base substrate;
a first conductive layer located above the base substrate and a second conductive layer located above the first conductive layer, the first conductive layer and the second conductive layer being insulated from each other;

a plurality of groups of light-emitting element terminals, arranged in an array on the second conductive layer for coupling with light-emitting elements;

a plurality of groups of sensor terminals, arranged on the second conductive layer for coupling with sensors, wherein no overlap exists between an orthographic projection of the groups of sensor terminals on the base substrate and an orthographic projection of the groups of light-emitting element terminals on the base substrate;

a first group of signal lines, disposed on the first conductive layer and electrically connected to the groups of sensor terminals for driving the sensors to sense; and a second group of signal lines, disposed on the first conductive layer and electrically connected to the group of light-emitting element terminals for driving the light-emitting elements to emit light.

20. A display device, comprising a light-emitting substrate, wherein the light-emitting substrate comprises:

an array substrate;

light-emitting elements, coupled to the groups of light-emitting element terminals of the array substrate; and sensors, coupled to the groups of sensor terminals of the array substrate, wherein the array substrate comprises:

a base substrate;

a first conductive layer located above the base substrate and a second conductive layer located above the first conductive layer, the first conductive layer and the second conductive layer being insulated from each other;

a plurality of groups of light-emitting element terminals, arranged in an array on the second conductive layer for coupling with light-emitting elements;

a plurality of groups of sensor terminals, arranged on the second conductive layer for coupling with sensors, wherein no overlap exists between an orthographic projection of the groups of sensor terminals on the base substrate and an orthographic projection of the groups of light-emitting element terminals on the base substrate;

a first group of signal lines, disposed on the first conductive layer and electrically connected to the groups of sensor terminals for driving the sensors to sense; and a second group of signal lines, disposed on the first conductive layer and electrically connected to the group of light-emitting element terminals for driving the light-emitting elements to emit light.

* * * * *